United States Patent
Im et al.

(10) Patent No.: US 12,550,541 B2
(45) Date of Patent: Feb. 10, 2026

(54) DISPLAY DEVICE

(71) Applicant: Samsung Display Co., LTD., Yongin-si (KR)

(72) Inventors: Choong Youl Im, Yongin-si (KR); Hyun Duck Cho, Yongin-si (KR); Kook Hyun Choi, Yongin-si (KR); Ji Hyun Kim, Yongin-si (KR); Jun Hee Lee, Yongin-si (KR); Ha Seok Jeon, Yongin-si (KR); Beohm Rock Choi, Yongin-si (KR)

(73) Assignee: Samsung Display Co., LTD., Yongin-si (KR)

( * ) Notice: Subject to any disclaimer, the term of this patent is extended or adjusted under 35 U.S.C. 154(b) by 405 days.

(21) Appl. No.: 18/299,099

(22) Filed: Apr. 12, 2023

(65) Prior Publication Data
US 2024/0040847 A1    Feb. 1, 2024

(30) Foreign Application Priority Data
Jul. 26, 2022    (KR) ........................ 10-2022-0092498

(51) Int. Cl.
H10K 59/122    (2023.01)
H10K 59/38    (2023.01)
H10K 59/80    (2023.01)

(52) U.S. Cl.
CPC ........... *H10K 59/122* (2023.02); *H10K 59/38* (2023.02); *H10K 59/8792* (2023.02)

(58) Field of Classification Search
CPC ... H10K 59/122; H10K 59/38; H10K 59/8792
See application file for complete search history.

(56) References Cited

U.S. PATENT DOCUMENTS

| | | |
|---|---|---|
| 2020/0251528 A1 | 8/2020 | Lee |
| 2021/0098539 A1 | 4/2021 | Zhang et al. |
| 2021/0104578 A1 | 4/2021 | Jo et al. |
| 2021/0359012 A1 | 11/2021 | Im et al. |

FOREIGN PATENT DOCUMENTS

| | | |
|---|---|---|
| CN | 113130619 | 7/2021 |
| CN | 114068660 | 2/2022 |
| KR | 10-2021-0093419 | 7/2021 |
| WO | 2022/009257 | 1/2022 |

OTHER PUBLICATIONS

Extended European Search Report for European Application No. 23171845.3, dated Dec. 19, 2023.

*Primary Examiner* — Anne M Hines
(74) *Attorney, Agent, or Firm* — F. CHAU & ASSOCIATES, LLC

(57) ABSTRACT

A display device includes pixels and emission areas, a light blocking layer including holes overlapping the emission areas, and color filters in the holes of the light blocking layer and overlapping the emission areas, the color filters include a first color filter overlapping a first emission area, a second color filter overlapping a second emission area, and a third color filter overlapping a third emission area, an area of the first emission area is greater than an area of the second emission area and an area of the third emission area and the area of the second emission area is greater than the area of the third emission area, and a ratio between opening widths of the first emission area, the second emission area, and the third emission area is about 1.33:1.15:1 to about 1.43:1.25:1.

20 Claims, 25 Drawing Sheets

EA3 : SEA1, SEA2

EA3 : SEA1, SEA2

EA3 : SEA1, SEA2

DISPLAY DEVICE

CROSS-REFERENCE TO RELATED APPLICATION(S)

This application claims priority to and benefits of Korean Patent Application No. 10-2022-0092498 under 35 U.S.C. § 119 filed on Jul. 26, 2022 in the Korean Intellectual Property Office, the entire contents of which are incorporated by reference.

BACKGROUND

1. Technical Field

The disclosure relates to a display device.

2. Description of the Related Art

As the information society develops, the demand for display devices for displaying images has increased and diversified. For example, display devices have been applied to various electronic devices such as smartphones, digital cameras, laptop computers, navigation devices, and smart televisions. The display devices may be flat panel display devices such as liquid crystal display devices, field emission display devices, or organic light emitting display devices. Among such flat panel display devices, a light emitting display device may display an image without a backlight unit providing light to a display panel because each of pixels of the display panel may include light emitting elements that may emit light by themselves.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device which may include color filters disposed on light emitting elements and in which a mura caused by reflection of external light is reduced.

However, aspects of the disclosure are not restricted to those set forth herein. The above and other aspects of the disclosure will become more apparent to one of ordinary skill in the art to which the disclosure pertains by referencing the detailed description of the disclosure given below.

According to an embodiment of the disclosure, a display device may include pixels disposed in a first direction and a second direction intersecting the first direction and the pixels including emission areas including light emitting elements; a light blocking layer including holes overlapping the emission areas in plan view and disposed between adjacent emission areas; and color filters disposed in the holes of the light blocking layer and overlapping the emission areas in plan view, wherein the emission areas include a first emission area emitting light of a first color; a second emission area emitting light of a second color of a shorter wavelength band than the light of the first color; and a third emission area emitting light of a third color of a shorter wavelength band than the light of the first color and the light of the second color, the color filters are disposed on the light blocking layer such that adjacent ones of the color filters at least partially overlap each other in plan view, the color filters include a first color filter overlapping the first emission area in plan view and selectively transmitting the light of the first color; a second color filter overlapping the second emission area in plan view and selectively transmitting the light of the second color; and a third color filter overlapping the third emission area in plan view and selectively transmitting the light of the third color, an area of the first emission area is greater than an area of the second emission area, and an area of the third emission area and the area of the second emission area is greater than the area of the third emission area, and a ratio between opening widths of the first emission area, the second emission area, and the third emission area is about 1.33:1.15:1 to about 1.43:1.25:1.

A ratio between areas of the first color filter, the second color filter, and the third color filter may be different from a ratio between the areas of the first emission area, the second emission area, and the third emission area.

The third emission area may include a first sub-emission area and a second sub-emission area spaced apart from each other in the second direction, and each of the first emission area and the second emission area may have a greater area than each of the first sub-emission area and the second sub-emission area.

The third emission area may include a third sub-emission area spaced apart from the second sub-emission area in the second direction, and the second emission area may include a fourth sub-emission area and a fifth sub-emission area spaced apart from each other in the second direction.

Each of the fourth sub-emission area and the fifth sub-emission area may have a smaller area than an area of the first emission area, and may have a greater area than the first sub-emission area, the second sub-emission area, and the third sub-emission area.

Each of the first emission area, the second emission area, and the third emission area may have a substantially polygonal shape, and sides of each of the first emission area, the second emission area, and the third emission area may be not parallel to the first direction and the second direction.

A direction of an opening length of the first emission area and a direction of an opening length of the third emission area may be inclined from the second direction.

The pixels may include a first pixel; a second pixel adjacent to the first pixel in the first direction; and a third pixel adjacent to the first pixel in the second direction, and the direction of the opening length of the first emission area disposed in the first pixel may be parallel to the direction of the opening length of the first emission area disposed in the second pixel.

The pixels may include a first pixel; a second pixel adjacent to the first pixel in the first direction; and a third pixel adjacent to the first pixel in the second direction, and the direction of the opening length of the first emission area disposed in the first pixel may not be parallel to the direction of the opening length of the first emission area disposed in the second pixel.

Each of the first emission area, the second emission area, and the third emission area may have a substantially circular shape.

A center of at least one of the first emission area, the second emission area, and the third emission area may be offset from a center of a corresponding one of the color filters in plan view.

According to an embodiment of the disclosure, a display device may include a display layer including a pixel defining film including openings forming emission areas emitting light of different colors and including light emitting elements; a light blocking layer disposed on the display layer and including holes overlapping the emission areas in plan view; and color filters disposed in the holes on the light blocking layer and overlapping the emission areas in plan view, wherein the pixel defining film may include a first opening forming a first emission area emitting light of a first color; a second opening forming a second emission area emitting light of a second color of a shorter wavelength band than the light of the first color; and a third opening forming a third emission area emitting light of a third color of a shorter wavelength band than the light of the first color and the light of the second color, the color filters include a first color filter of the first color overlapping the first emission area in plan view, a second color filter of the second color overlapping the second emission area in plan view, and a third color filter of the third color overlapping the third emission in plan view area, portions of the second color filter are disposed on the first color filter and the third color filter adjacent to the second color filter, on the light blocking layer, an area of the first opening is greater than an area of the second opening and an area of the third opening and the area of the second opening is greater than the area of the third opening, and opening widths of the first opening, the second opening, and the third opening in a first direction and opening lengths of the first opening, the second opening, and the third opening in a second direction intersecting the first direction are different from each other, respectively.

A ratio between the opening widths of the first opening, the second opening, and the third opening may be about 1.33:1.15:1 to about 1.43:1.25:1.

Sides of each of the first opening, the second opening, and the third opening in the first direction may have a curvature, and sides of each of the first opening, the second opening, and the third opening in the second direction may have a substantially linear shape.

Sides of each of the first opening, the second opening, and the third opening in the first direction may have a substantially convex shape, and sides of each of the first opening, the second opening, and the third opening in the second direction may have a substantially inwardly concave shape.

Each of the first opening, the second opening, and the third opening may have a substantially polygonal shape.

Respective sides of each of the first opening, the second opening, and the third opening may not be parallel to the first direction and the second direction intersecting the first direction.

A center of the first opening may be offset from a center of the first color filter in plan view.

A ratio between areas of the first color filter, the second color filter, and the third color filter may be different from a ratio between the areas of the first opening, the second opening, and the third opening.

The display device may further comprise a color pattern disposed on the light blocking layer, the color pattern and the first color filter may have a same color, wherein the color pattern may contact the third color filter.

In a display device according to an embodiment, a ratio between areas, widths, or lengths of emission areas in which light emitting elements emitting light of different colors are disposed or openings of a pixel defining film may be designed so that a mura caused by reflection of external light becomes white. In the display device, a shape of the emission areas or the openings of the pixel defining film may be designed so that the mura caused by the reflection of the external light is dispersed. Accordingly, the display device may prevent reflected lights by the external light from being viewed like a mura as a repeated pattern, and may provide a user with a better user experience.

The effects of the disclosure are not limited to the aforementioned effects, and various other effects are included in the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
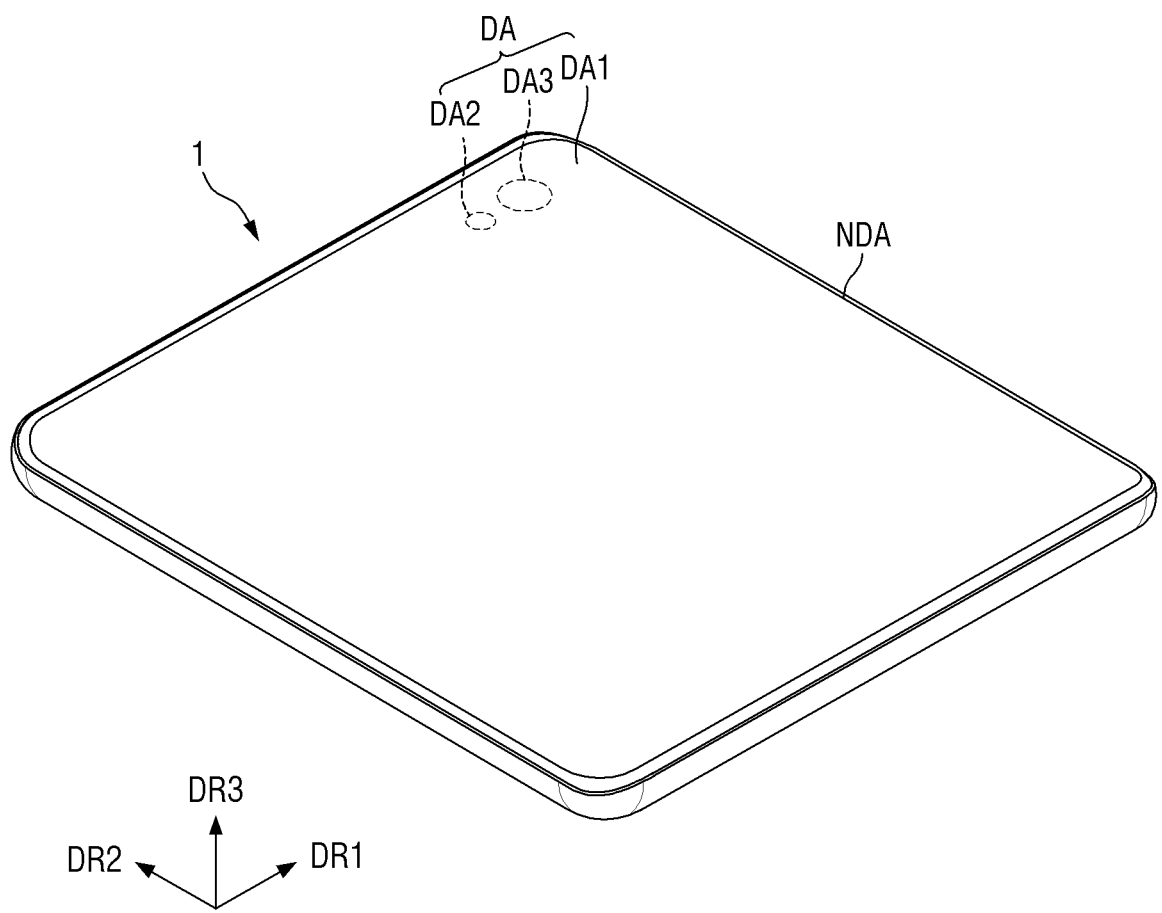
FIG. 1 is a schematic perspective view of an electronic device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will also be understood that when a layer is referred to as being "on" another layer or substrate, it can be directly on the other layer or substrate, or intervening layers may also be present.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described with reference to the accompanying drawings.

FIG. 1 is a schematic plan view of a display device according to an embodiment.

Referring to FIG. 1, an electronic device 1 displays a moving image or a still image. The electronic device 1 may refer to all electronic devices that provide display screens. For example, televisions, laptop computers, monitors, billboards, the Internet of Things (IoT), mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras, camcorders, and the like, which provide display screens, may be included in the electronic device 1.

The electronic device 1 may include a display device 10 (see FIG. 2) providing a display screen. Examples of the display device may include an inorganic light emitting diode display device, an organic light emitting display device, a quantum dot light emitting display device, a plasma display device, a field emission display device, and the like within the spirit and the scope of the disclosure. Hereinafter, a case where an inorganic light emitting diode display device is applied as an example of the display device will be described by way of example, but the disclosure is not limited thereto, and the same technical spirit may be applied to other display devices where applicable.

A shape of the electronic device 1 may be variously modified. For example, the electronic device 1 may have a shape such as a rectangular shape with a width greater than a length, a rectangular shape with a length greater than a width, a square shape, a rectangular shape with rounded corners (vertices), other polygonal shapes, or a circular shape. A shape of a display area DA of the electronic device 1 may also be similar to an overall shape of the electronic device 1. In FIG. 1, the electronic device 1 having a rectangular shape with a great length in a first direction DR1 is illustrated.

The electronic device 1 may include a display area DA and a non-display area NDA. The display area DA is an area in which a screen may be displayed, and the non-display area NDA is an area in which a screen is not displayed. The display area DA may also be referred to as an active area, and the non-display area NDA may also be referred to as a non-active area. The display area DA may occupy substantially the center of the electronic device 1.

The display area DA may include a first display area DA1, a second display area DA2, and a third display area DA3. The second display area DA2 and the third display area DA3 may be areas in which components for adding various functions to the electronic device 1 are disposed, and may correspond to component areas.

Figure 2:
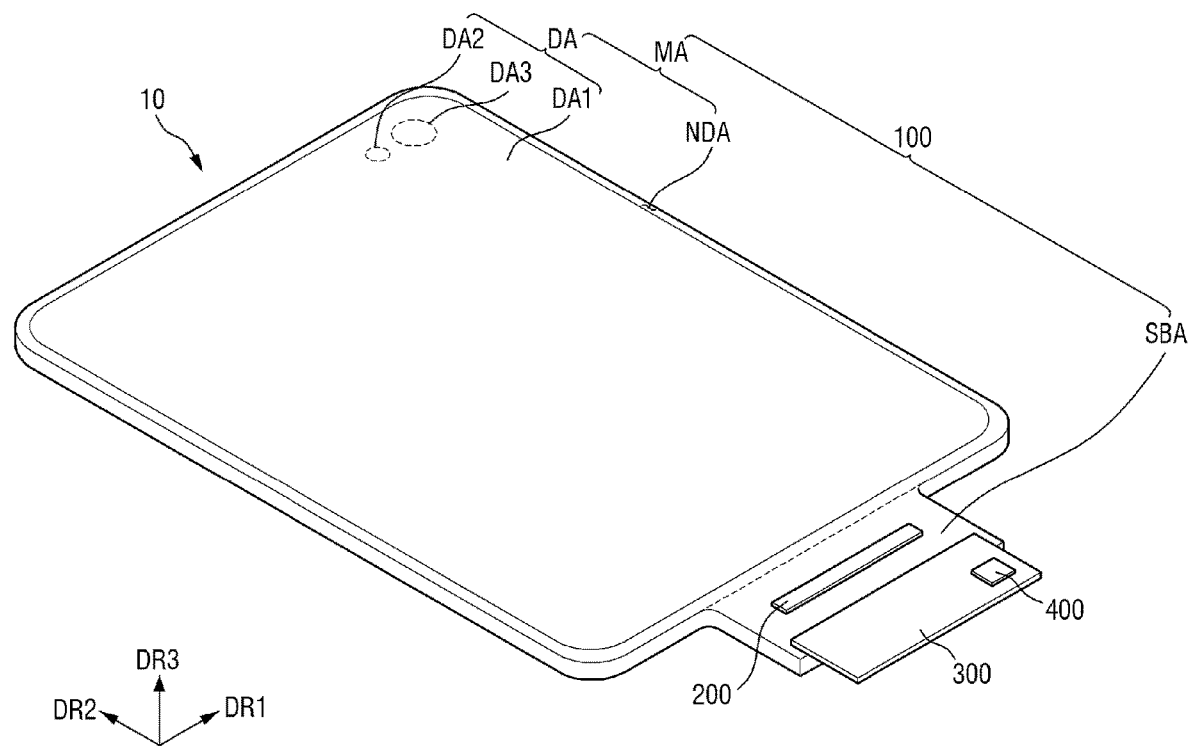
FIG. 2 is a schematic perspective view illustrating a display device included in the electronic device according to an embodiment.

FIG. 2 is a schematic perspective view illustrating a display device included in the electronic device according to an embodiment.

Referring to FIG. 2, an electronic device 1 according to an embodiment may include a display device 10. The display device 10 may provide a screen displayed by the electronic device 1. The display device 10 may have a shape similar to that of the electronic device 1, in plan view. For example, the display device 10 may have a shape similar to a rectangular shape having sides in the first direction DR1 and sides in a second direction DR2. A corner where the side in the first direction DR1 and the side in the second direction DR2 meet may be rounded with a curvature, but is not limited thereto, and may also be right-angled. The shape of the display device 10 in plan view is not limited to the rectangular shape, and may be a shape similar to other polygonal shapes, a circular shape, or an elliptical shape.

The display device 10 may include a display panel 100, a display driver 200, a circuit board 300, and a touch driver 400.

The display panel 100 may include a main area MA and a sub-area SBA.

The main area MA may include a display area DA including pixels displaying an image and a non-display area NDA disposed around the display area DA. The display area DA may include a first display area DA1, a second display area DA2, and a third display area DA3. The display area DA may emit light from emission areas or opening areas. For example, the display panel 100 may include pixel circuits including switching elements, a pixel defining film defining the emission areas or the opening areas, and self-light emitting elements.

For example, the self-light emitting element may include at least one of an organic light emitting diode (LED) including an organic light emitting layer, a quantum dot LED including a quantum dot light emitting layer, an inorganic LED including an inorganic semiconductor, and a micro LED, but is not limited thereto.

The non-display area NDA may be an area outside the display area DA. The non-display area NDA may be defined as an edge area of the main area MA of the display panel 100. The non-display area NDA may include a gate driver (not illustrated) supplying gate signals to gate lines, and fan-out lines (not illustrated) connecting the display driver 200 and the display area DA to each other.

The sub-area SBA may be an area extending from one side or a side of the main area MA. The sub-area SBA may include a flexible material that may be bent, folded, and rolled. For example, in case that the sub-area SBA is bent, the sub-area SBA may overlap the main area MA in a thickness direction (third direction DR3). The sub-area SBA may include the display driver 200 and pad parts connected to the circuit board 300. In an embodiment, the sub-area SBA may be omitted, and the display driver 200 and the pad parts may be disposed in the non-display area NDA.

The display driver 200 may output signals and voltages for driving the display panel 100. The display driver 200 may supply data voltages to data lines. The display driver 200 may supply a source voltage to a power line and supply gate control signals to the gate driver. The display driver 200 may be formed as an integrated circuit (IC) and be mounted on the display panel 100 in a chip on glass (COG) manner, a chip on plastic (COP) manner, or an ultrasonic bonding manner. As an example, the display driver 200 may be disposed in the sub-area SBA, and may overlap the main area MA in the thickness direction by bending of the sub-area SBA. As another example, the display driver 200 may be mounted on the circuit board 300.

The circuit board 300 may be attached onto the pad parts of the display panel 100 using an anisotropic conductive film (ACF). Lead lines of the circuit board 300 may be electrically connected to the pad parts of the display panel 100. The circuit board 300 may be a flexible printed circuit board, a printed circuit board, or a flexible film such as a chip on film.

The touch driver 400 may be mounted on the circuit board 300. The touch driver 400 may be electrically connected to a touch sensing unit included in the electronic device 1. The touch driver 400 may supply touch driving signals to touch electrodes of the touch sensing unit and sense change amounts in capacitance between the touch electrodes. For example, the touch driving signal may be a pulse signal having a given frequency. The touch driver 400 may decide whether or not an input has been generated and calculate input coordinates, based on the change amounts in capacitance between the touch electrodes. The touch driver 400 may be formed as an integrated circuit (IC).

Figure 3:
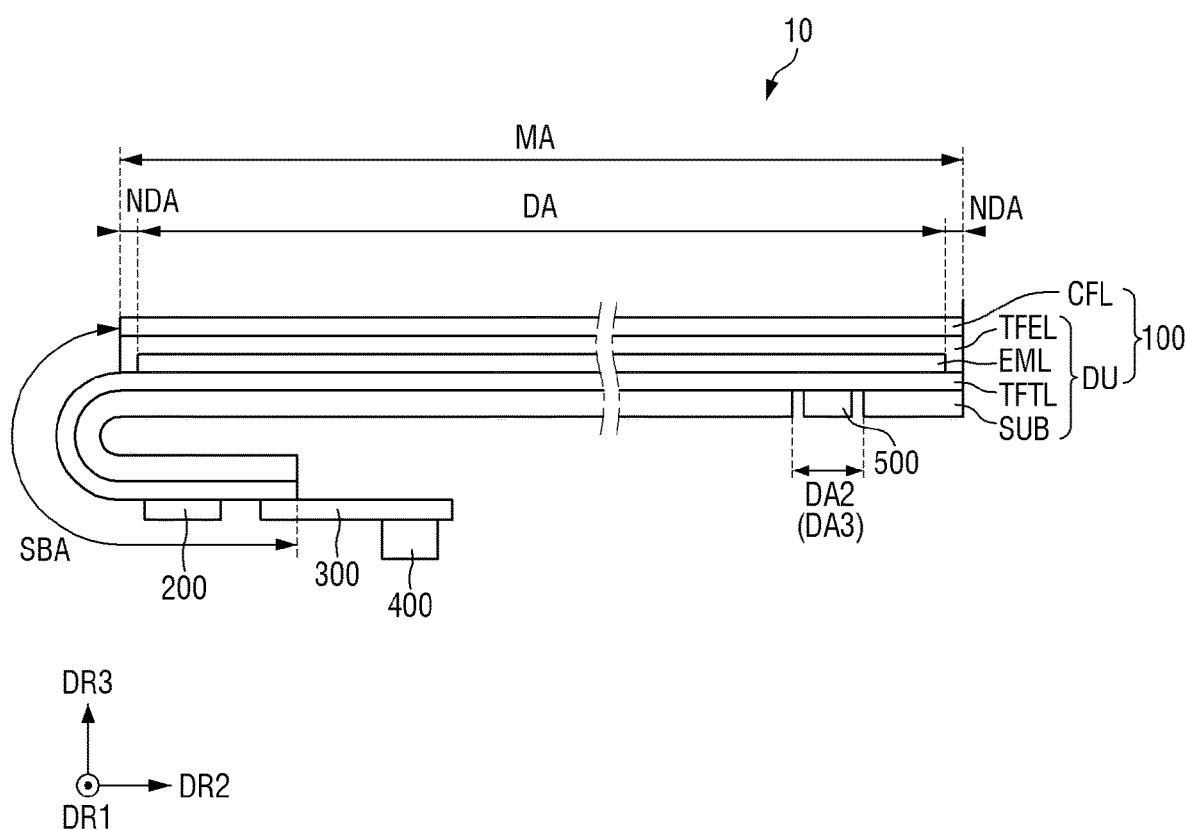
FIG. 3 is a schematic cross-sectional view of the display device of FIG. 2 viewed from the side.

FIG. 3 is a schematic cross-sectional view of the display device of FIG. 2 viewed from the side.

Referring to FIG. 3, the display panel 100 may include a display layer DU and a color filter layer CFL. The display layer DU may include a substrate SUB, a thin film transistor layer TFTL, a light emitting element layer EML, and an encapsulation layer TFEL.

The substrate SUB may be a base substrate or a base member. The substrate SUB may be a flexible substrate that may be bent, folded, and rolled. For example, the substrate SUB may include a polymer resin such as polyimide (PI), but is not limited thereto. In an embodiment, the substrate SUB may include a glass material or a metal material.

The thin film transistor layer TFTL may be disposed on the substrate SUB. The thin film transistor layer TFTL may include thin film transistors constituting pixel circuits of pixels. The thin film transistor layer TFTL may further include gate lines, data lines, power lines, gate control lines, fan-out lines connecting the display driver 200 and the data lines to each other, and lead lines connecting the display driver 200 and the pad parts to each other. Each of the thin film transistors may include a semiconductor region, a source electrode, a drain electrode, and a gate electrode. For example, in case that the gate driver is formed on one side or a side of the non-display area NDA of the display panel 100, the gate driver may include thin film transistors.

The thin film transistor layer TFTL may be disposed in the display area DA, the non-display area NDA, and the sub-area SBA. The thin film transistors of each of the pixels, the gate lines, the data lines, and the power lines of the thin film transistor layer TFTL may be disposed in the display area DA. The gate control lines and the fan-out lines of the thin film transistor layer TFTL may be disposed in the non-display area NDA. The lead lines of the thin film transistor layer TFTL may be disposed in the sub-area SBA.

The light emitting element layer EML may be disposed on the thin film transistor layer TFTL. The light emitting element layer EML may include light emitting elements including a first electrode, a second electrode, and a light emitting layer to emit light and a pixel defining film defining the pixels. The light emitting elements of the light emitting element layer EML may be disposed in the display area DA.

In an embodiment, the light emitting layer may be an organic light emitting layer including an organic material. The light emitting layer may include a hole transporting layer, an organic light emitting layer, and an electron transporting layer. In case that the first electrode receives a voltage through the thin film transistor of the thin film transistor layer TFTL and the second electrode receives a cathode voltage, holes and electrons may move to the organic light emitting layer through the hole transporting layer and the electron transporting layer, respectively, and may be combined with each other in the organic light emitting layer to emit light.

In an embodiment, the light emitting element may include a quantum dot light emitting diode including a quantum dot light emitting layer, an inorganic light emitting diode including an inorganic semiconductor, or a micro light emitting diode.

The encapsulation layer TFEL may cover an upper surface and side surfaces of the light emitting element layer EML, and may protect the light emitting element layer EML. The encapsulation layer TFEL may include at least one inorganic film and at least one organic film for encapsulating the light emitting element layer EML.

The color filter layer CFL may be disposed on the encapsulation layer TFEL. The color filter layer CFL may include color filters each corresponding to the emission areas. Each of the color filters may selectively transmit light of a specific (or given) wavelength and block or absorb light of other wavelengths. The color filter layer CFL may absorb a portion of light introduced from the outside of the display device 10 to reduce reflected light by external light. Accordingly, the color filter layer CFL may prevent distortion of colors due to external light reflection.

Since the color filter layer CFL is directly disposed on the encapsulation layer TFEL, the display device 10 may not require a separate substrate for the color filter layer CFL. Accordingly, a thickness of the display device 10 may be relatively small.

In an embodiment, the display device 10 may further include an optical device 500. The optical device 500 may be disposed in the second display area DA2 or the third display area DA3. The optical device 500 may emit or receive light of infrared, ultraviolet, and visible light bands. For example, the optical device 500 may be an optical sensor sensing light incident on the display device 10, such as a proximity sensor, an illuminance sensor, and a camera sensor, or an image sensor.

Figure 4:
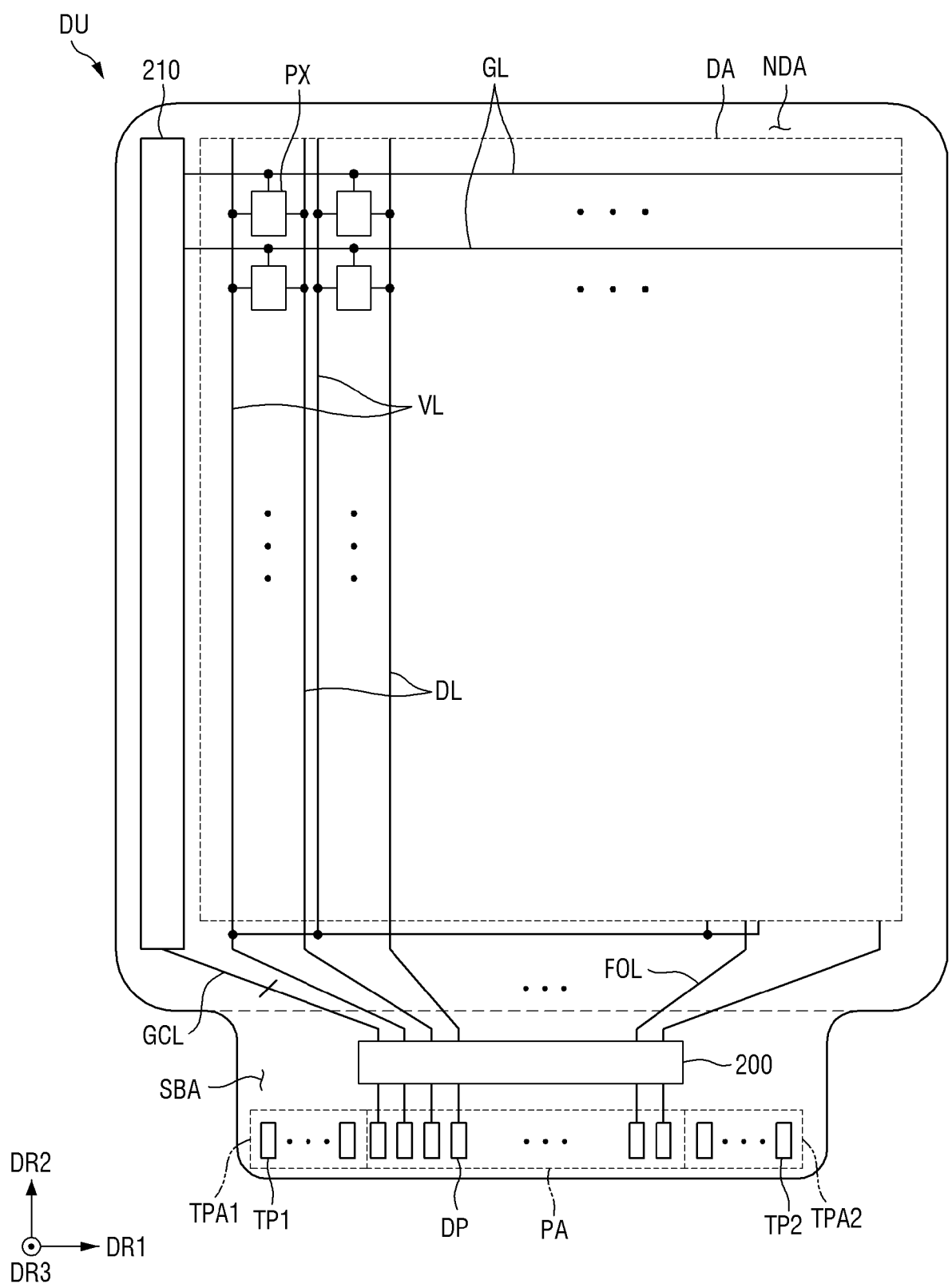
FIG. 4 is a schematic plan view illustrating a display layer of the display device according to an embodiment.

FIG. 4 is a schematic plan view illustrating a display layer of the display device according to an embodiment.

Referring to FIG. 4, the display layer DU may include a display area DA and a non-display area NDA.

The display area DA may be disposed at the center of the display panel 100. Pixels PX, gate lines GL, data lines DL, and power lines VL may be disposed in the display area DA. Each of the pixels PX may be defined as a minimum unit emitting light.

The gate lines GL may supply gate signals received from a gate driver 210 to the pixels PX. The gate lines GL may extend in the first direction DR1, and may be spaced apart from each other in the second direction DR2 crossing the first direction DR1.

The data lines DL may supply data voltages received from the display driver 200 to the pixels PX. The data lines DL may extend in the second direction DR2, and may be spaced apart from each other in the first direction DR1.

The power lines VL may supply a source voltage received from the display driver 200 to the pixels PX. Here, the source voltage may be at least one of a driving voltage, an initialization voltage, a reference voltage, and a low potential voltage. The power lines VL may extend in the second direction DR2, and may be spaced apart from each other in the first direction DR1.

The non-display area NDA may surround or may be adjacent to the display area DA. The gate driver 210, fan-out lines FOL, and gate control lines GCL may be disposed in the non-display area NDA. The gate driver 210 may generate gate signals based on gate control signals, and may sequentially supply the gate signals to the gate lines GL according to a set order.

The fan-out lines FOL may extend from the display driver 200 to the display area DA. The fan-out lines FOL may supply data voltages received from the display driver 200 to the data lines DL.

The gate control lines GCL may extend from the display driver 200 to the gate driver 210. The gate control lines GCL may supply the gate control signals received from the display driver 200 to the gate driver 210.

The sub-area SBA may include the display driver 200, a pad area PA, and first and second touch pad areas TPA1 and TPA2. The first and second touch pad areas TPA1 and TPA2 may also include touch pads TP1 and TP2.

The display driver 200 may output signals and voltages for driving the display panel 100 to the fan-out lines FOL. The display driver 200 may supply the data voltages to the data lines DL through the fan-out lines FOL. The data voltages may be supplied to the pixels PX, and may control luminance of the pixels PX. The display driver 200 may supply the gate control signals to the gate driver 210 through the gate control lines GCL.

The pad area PA, the first touch pad area TPA1, and the second touch pad area TPA2 may be disposed at an edge of the sub-area SBA. The pad area PA, the first touch pad area TPA1, and the second touch pad area TPA2 may be electrically connected to the circuit board 300 using a material such as an anisotropic conductive film or a self assembly anisotropic conductive paste (SAP).

The pad area PA may include display pad parts DP. The display pad parts DP may be connected to a graphic system through the circuit board 300. The display pad parts DP may be connected to the circuit board 300 to receive digital video data, and may supply the digital video data to the display driver 200.

Figure 5:
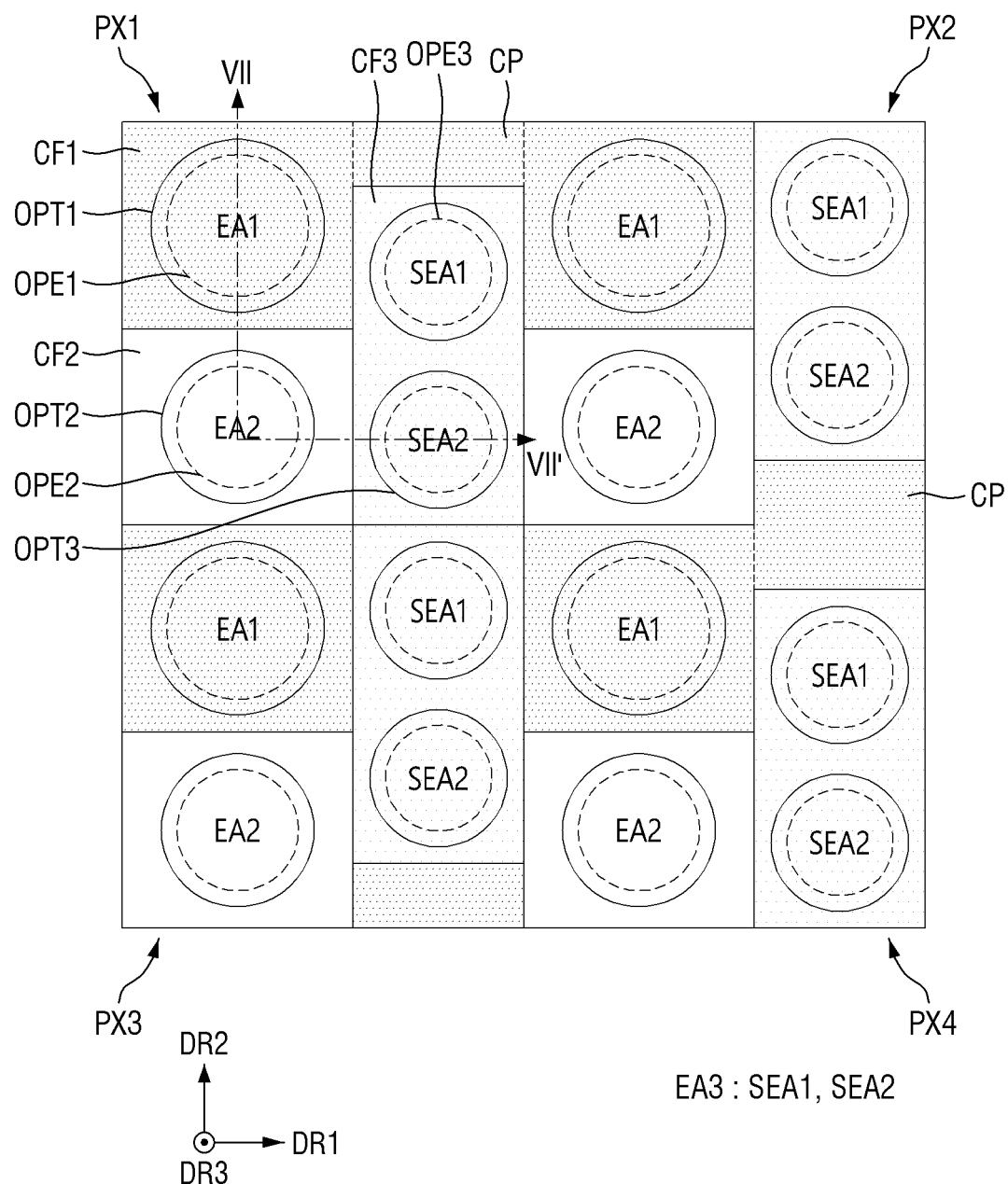
FIG. 5 is a schematic plan view illustrating layouts of emission areas and color filters in a display area of the display device according to an embodiment.
Figure 6:
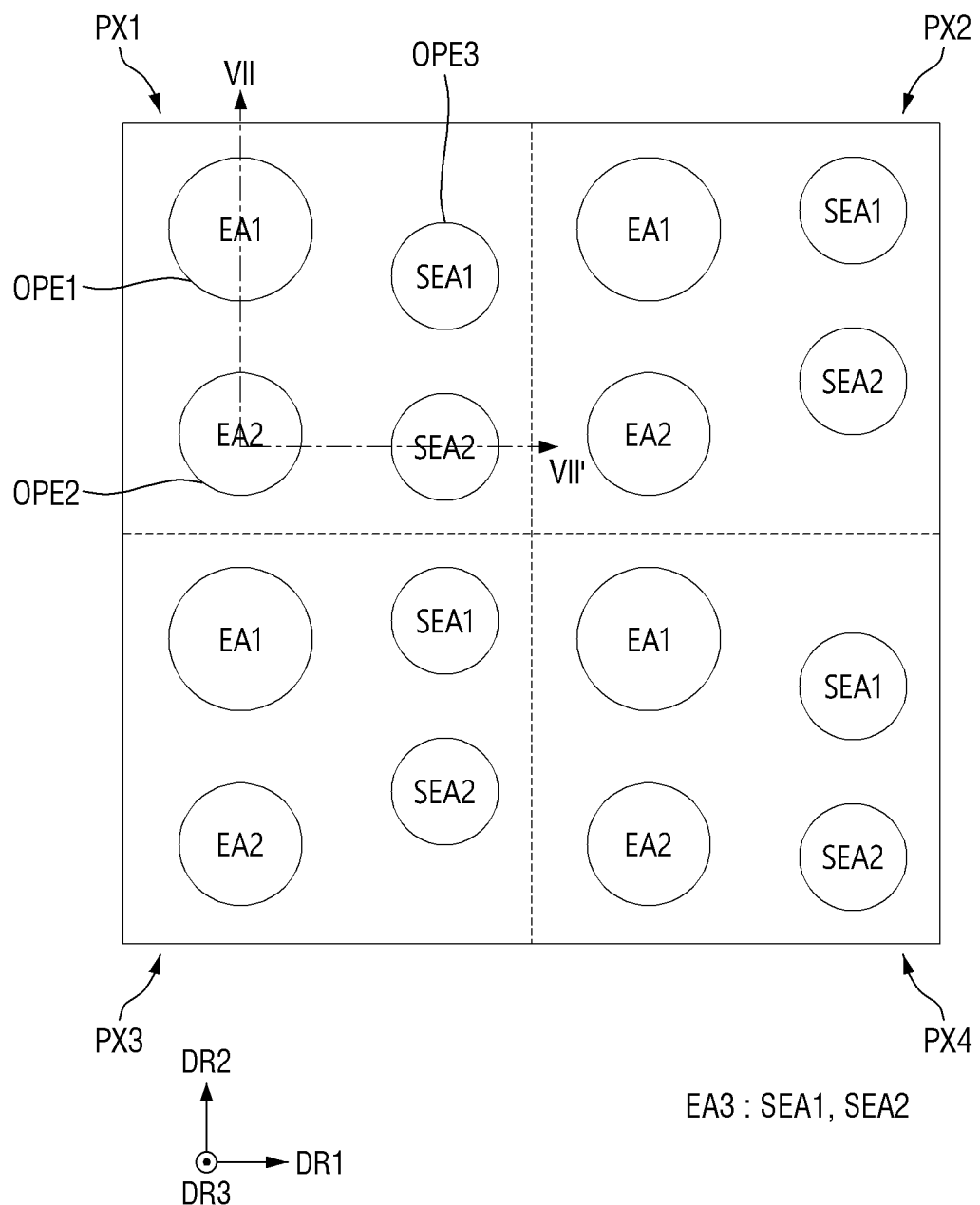
FIG. 6 is a schematic plan view illustrating a layout of emission areas disposed in the display area of FIG. 5.

FIG. 5 is a schematic plan view illustrating layouts of emission areas and color filters in a display area of the display device according to an embodiment. FIG. 6 is a schematic plan view illustrating a layout of emission areas disposed in the display area of FIG. 5.

Referring to FIGS. 5 and 6, the display device 10 may include pixels PX1, PX2, PX3, and PX4 disposed in the display area DA and emission areas EA1, EA2, and EA3 disposed in each of the pixels PX1, PX2, PX3, and PX4. The display area DA illustrated in FIGS. 5 and 6 is the first display area DA1, and the pixels PX1, PX2, PX3, and PX4 and the emission areas EA1, EA2, and EA3 may be disposed in the first display area DAL However, the pixels PX1, PX2, PX3, and PX4 and the emission areas EA1, EA2, and EA3 may also be disposed in the second display area DA2 and the third display area DA3 of the display area DA.

The pixels PX1, PX2, PX3, and PX4 may be arranged (or disposed) in the first direction DR1 and the second direction DR2. A first pixel PX1 and a second pixel PX2 may be disposed adjacent to each other in the first direction DR1, and the first pixel PX1 and a third pixel PX3 may be disposed adjacent to each other in the second direction DR2. The third pixel PX3 and a fourth pixel PX4 may be disposed adjacent to each other in the first direction DR1, and the second pixel PX2 and the fourth pixel PX4 may be disposed adjacent to each other in the second direction DR2. The pixels PX1, PX2, PX3, and PX4 may be arranged in a linear or island-shaped pattern in the display area DA.

However, a layout or an arrangement of the pixels PX1, PX2, PX3, and PX4 is not limited to that illustrated in FIGS. 5 and 6. In an embodiment, the pixels PX1, PX2, PX3, and PX4 may be disposed in a PENTILE™ type, for example, a diamond PENTILE™ type.

The emission areas EA1, EA2, and EA3 of each of the pixels PX1, PX2, PX3, and PX4 may include a first emission area EA1, a second emission area EA2, and a third emission area EA3 that emit light of different colors. Unlike the first emission area EA1 and the second emission area EA2, the third emission area EA3 may include sub-emission areas SEA1 and SEA2 spaced apart from each other. The third emission area EA3 may include a first sub-emission area SEA1 and a second sub-emission area SEA2 spaced apart from the first sub-emission area SEA1 in the second direction DR2. The first sub-emission area SEAL and the second sub-emission area SEA2 are structurally separated from each other, but may emit light of the same color to constitute one third emission area EA3.

The first to third emission areas EA1, EA2, and EA3 may emit red, green, or blue light, respectively, and colors of the light emitted from the respective emission areas EA1, EA2, and EA3 may be different depending on a type of light emitting element ED (see FIG. 7) disposed in a light emitting element layer EML to be described later. In an embodiment, the first emission area EA1 may emit first light, which is red light, the second emission area EA2 may emit second light, which is green light, and the third emission area EA3 or the sub-emission areas SEA1 and SEA2 of the third emission area EA3 may emit third light, which is blue light.

The emission areas EA1, EA2, and EA3 may have a circular shape in plan view. However, the disclosure is not limited thereto. In an embodiment, the emission areas EA1, EA2, and EA3 may have a polygonal shape, an elliptical shape, or a shape of which each side is curved.

Within the pixels PX1, PX2, PX3, and PX4, the emission areas EA1, EA2, and EA3 may be disposed in the first direction DR1, the second direction DR2, or a diagonal direction between the first direction DR1 and the second direction DR2. For example, the first emission area EA1 and the second emission area EA2 may be disposed to be spaced apart from each other in the second direction DR2 within each of the pixels PX1, PX2, PX3, and PX4, and the first emission areas EA1 and the second emission areas EA2 may be alternately disposed in the second direction DR2 over the entire display area DA. The first emission area EA1 of the third pixel PX3 may be disposed between the second emission area EA2 of the first pixel PX1 and the second emission area EA2 of the third pixel PX3.

The third emission area EA3 may be disposed to be spaced apart from the first emission area EA1 and the second emission area EA2 in the first direction DR1 or the diagonal direction within each of the pixels PX1, PX2, PX3, and PX4. A layout of the sub-emission areas SEA1 and SEA2 of the third emission area EA3 may be different for each of the pixels PX1, PX2, PX3, and PX4. For example, in the first pixel PX1 and the fourth pixel PX4, the first sub-emission area SEA1 may be disposed to be spaced apart from the first emission area EA1 and the second emission area EA2 in the diagonal direction, but may be disposed adjacent to the first emission area EA1. The second sub-emission area SEA2 may be disposed to be spaced apart from the second emission area EA2 in the first direction DR1. On the other hand, in the second pixel PX2 and the third pixel PX3, the first sub-emission area SEA1 may be disposed to be spaced apart from the first emission area EA1 in the first direction DR1. The second sub-emission area SEA2 may be disposed to be spaced apart from the first emission area EA1 and the second emission area EA2 in the diagonal direction, but may be disposed adjacent to the second emission area EA2. Layouts of the third emission areas EA3 in different pixels PX1, PX2, PX3, and PX4 may be different from each other depending on layouts of color filters CF1, CF2, and CF3 and color patterns CP to be described later.

Third emission areas EA3 or the sub-emission areas SEA1 and SEA2 of the third emission areas EA3 may be repeatedly disposed in the second direction DR2 over the entire display area DA. For example, a pair of first sub-emission areas SEA1 and second sub-emission areas SEA2 may be repeatedly disposed along the second direction DR2 over the entire display area DA, and the first sub-emission areas SEA1 and the second sub-emission areas SEA2 may be alternately and repeatedly disposed along the second direction DR2. The pair of first sub-emission areas SEA1 and second sub-emission areas SEA2 may be disposed between the first emission areas EA1 or the second emission areas EA2 of two different pixels PX1, PX2, PX3, and PX4. The third emission area EA3 of the first pixel PX1 may be disposed between the first emission area EA1 and the second emission area EA2 of the first pixel PX1 and the first emission area EA1 of the first pixel PX1 and the second emission area EA2 of the first pixel PX1.

However, a layout of the emission areas EA1, EA2, and EA3 is not limited to that illustrated in FIGS. 5 and 6. Similar to the pixels PX1, PX2, PX3, and PX4, the emission areas EA1, EA2, and EA3 may be disposed in a PENTILE™ type, for example, a diamond PENTILE™ type.

The first to third emission areas EA1, EA2, and EA3 may be defined, respectively, by openings OPE1, OPE2, and OPE3 formed in the pixel defining film PDL of the light emitting element layer EML. For example, the first emission area EA1 may be defined by a first opening OPE1 of the pixel defining film, the second emission area EA2 may be defined by a second opening OPE2 of the pixel defining film, and the third emission area EA3 may be defined by a third opening OPE3 of the pixel defining film.

In an embodiment, areas or sizes of the first to third emission areas EA1, EA2, and EA3 may be different from each other. In an embodiment of FIG. 5, an area of the first emission area EA1 may be greater than an area of each of the second emission area EA2 and the sub-emission areas SEA1 and SEA2 of the third emission area EA3, and an area of the second emission area EA2 may be greater than an area of each of the sub-emission areas SEA1 and SEA2 of the third emission area EA3. The areas of the emission areas EA1, EA2, and EA3 may change depending on sizes of the openings OPE1, OPE2, and OPE3 formed in the pixel defining film PDL. An intensity of light emitted from the emission areas EA1, EA2, and EA3 may change depending on the areas of the emission areas EA1, EA2, and EA3, and a color feeling of a screen displayed on the display device 10 or the electronic device 1 may be controlled by adjusting the areas of the emission area EA1, EA2, and EA3. The areas of the emission areas EA1, EA2, and EA3 may be related to light efficiency, lifetime of the light emitting element ED, and the like, and may have a trade-off relationship with external light reflection. The areas of the emission areas EA1, EA2, and EA3 may be adjusted in consideration of the above factors.

According to an embodiment, in the display device 10, the areas of the emission areas EA1, EA2, and EA3 or areas of the openings OPE1, OPE2, and OPE3 of the pixel defining film PDL may be designed so that reflected light by external light may be viewed as white mixed light. Lights incident on the display device 10 from the outside and reflected by the display device 10 may be reflected and diffracted at different positions depending on an area ratio between the emission areas EA1, EA2, and EA3, and accordingly, may be viewed as a mura having specific (or given) colors from the outside. In order to prevent such a mura, in the display device 10, the areas of the emission areas EA1, EA2, and EA3 or the areas of the openings OPE1, OPE2, and OPE3 of the pixel defining film PDL may be designed in a specific (or given) ratio. A detailed description thereof will be provided later.

In the display device 10 having the layout of the emission areas EA1, EA2, and EA3 as illustrated in FIG. 5, one first emission area EA1, one second emission area EA2, and two sub-emission areas SEA1 and SEA2 as one third emission area EA3 that are disposed adjacent to each other in each of the pixels PX1, PX2, PX3, and PX4 may form one pixel group. One pixel group may include the emission areas EA1, EA2, and EA3 emitting light of different colors to express a white gradation. However, the disclosure is not limited thereto, and a combination of the emission areas EA1, EA2, and EA3 constituting one pixel group may be variously modified depending on an arrangement of the emission areas EA1, EA2, and EA3, colors of the light emitted by the emission areas EA1, EA2, and EA3, and the like within the spirit and the scope of the disclosure.

The display device 10 may include color filters CF1, CF2, and CF3, collectively CF, disposed on the emission areas EA1, EA2, and EA3. The color filters CF1, CF2, and CF3 may be disposed on a light blocking layer BM (see FIG. 7) including holes OPT1, OPT2, and OPT3 disposed to correspond to the emission areas EA1, EA2, and EA3, or the openings OPE1, OPE2, and OPE3. The holes OPT1, OPT2, and OPT3 of the light blocking layer may be formed to overlap the openings OPE1, OPE2, and OPE3, and may form light emitting areas through which the light emitted from the emission areas EA1, EA2, and EA3 is emitted. Each of the color filters CF1, CF2, and CF3 may have a greater area than each of the holes OPT1, OPT2, and OPT3 of the light blocking layer and the openings OPE1, OPE2, and OPE3, and each of the color filters CF1, CF2, and CF3 may completely cover each of the light emitting area formed by the holes OPT1, OPT2, and OPT3.

The color filters CF1, CF2, and CF3 may be disposed to correspond to the emission areas EA1, EA2, and EA3, respectively. The color filters CF1, CF2, and CF3 may include a first color filter CF1, a second color filter CF2, and a third color filter CF3 disposed to correspond to different emission areas EA1, EA2, and EA3, respectively. The color filters CF1, CF2, and CF3 may include colorants such as dyes or pigments absorbing light of a wavelength band other than light of a specific (or given) wavelength band, and may be disposed to correspond to the colors of the light emitting from the emission areas EA1, EA2, and EA3. For example, the first color filter CF1 may be a red color filter disposed to overlap the first emission area EA1 and transmitting only the first light, which is the red light. The second color filter CF2 may be a green color filter disposed to overlap the second emission area EA2 and transmitting only the second light, which is the green light, and the third color filter CF3 may be a blue color filter disposed to overlap the sub-emission areas SEA1 and SEA2 of the third emission area EA3 and transmitting only the third light, which is the blue light.

Similar to the layout of the emission areas EA1, EA2, and EA3, the color filters CF1, CF2, and CF3 may be disposed in the first direction DR1, the second direction DR2, or the diagonal direction between the first direction DR1 and the second direction DR2. For example, the first color filter CF1 and the second color filter CF2 may be disposed adjacent to each other in the second direction DR2, and the first color filters CF1 and the second color filters CF2 may be alternately disposed in the second direction DR2 over the entire display area DA. The first color filter CF1 disposed in the third pixel PX3 may be disposed between the second color filter CF2 disposed in the first pixel PX1 and the second color filter CF2 disposed in the third pixel PX3. The third color filter CF3 may be disposed adjacent to the first color filter CF1 and the second color filter CF2 in the first direction DR1, and the third emission areas EA3 may be repeatedly disposed in the second direction DR2 over the entire display area DA. For example, the third color filter CF3 disposed in the first pixel PX1 may be disposed between the second color filter CF2 disposed in the first pixel PX1 and the second color filter CF2 disposed in the second pixel PX2.

In an embodiment, the display device 10 may include color patterns CP protruding from the first color filters CF1 in the first direction DR1 and disposed to be in contact with the third color filters CF3 in the second direction DR2. The color pattern CP may include the same material or a similar material as the first color filter CF1 and may be integrated with the first color filter CF1. The color pattern CP may include the same material or a similar material as the first color filter CF1 in consideration of a color feeling of light reflected in the display device 10 and be disposed in each of the pixels PX1, PX2, PX3, and PX4. The color pattern CP may be disposed adjacent to the third color filter CF3 in the second direction DR2, and a position at which the color pattern CP is disposed may be different for each of the pixels PX1, PX2, PX3, and PX4. For example, in the first pixel PX1 and the fourth pixel PX4, the color pattern CP may be disposed on the upper side, which is one side or a side of the third color filter CF3 in the second direction DR2, and in the second pixel PX2 and the third pixel PX3, the color pattern CP may be disposed on the lower side, which is the other side of the third color filter CF3 in the second direction DR2. The color pattern CP may be disposed across two pixels PX1, PX2, PX3, and PX4 adjacent to each other in the second direction DR2. Over the entire display area DA, color patterns CP may be disposed to be spaced apart from each other in the second direction DR2 or the diagonal direction.

According to an embodiment, in the display device 10, the areas of the emission areas EA1, EA2, and EA3 may be different from each other, and areas of the color filters CF1, CF2 and CF3 may also be different from each other. The emission areas EA1, EA2, and EA3 may have areas according to a specific (or given) ratio, and the color filters CF1, CF2, and CF3 may also have areas according to a specific (or given) ratio, similar to the emission areas EA1, EA2, and EA3. However, an area ratio between the emission areas EA1, EA2, and EA3 and an area ratio between the color filters CF1, CF2, and CF3 may be different from each other. A relative area ratio between the color filters CF1, CF2, and CF3 may affect a color feeling of reflected external light in case that the external light is reflected by the display device 10. The display device 10 may include the color filters CF1, CF2, and CF3 having the areas of the specific (or given) ratio and may include the color patterns CP including the same material or a similar material as the red color filter, such that a color feeling of the external light may have a color that is comfortable to a user's eyes.

However, a layout of the color filters CF1, CF2, and CF3 is not limited to that illustrated in FIGS. 5 and 6. Similar to the layout of the emission areas EA1, EA2, and EA3, the color filters CF1, CF2, and CF3 may be disposed in a PENTILE™ type, for example, a diamond PENTILE™ type. A layout of the protruding portion of the first color filter CF1 may be different from that illustrated in FIG. 6.

According to an embodiment, the color filters CF1, CF2, and CF3 may be disposed to partially overlap other adjacent color filters CF1, CF2, and CF3. It has been illustrated in FIG. 6 that the color filters CF1, CF2, and CF3 adjacent to each other are disposed to be in contact with each other, but as described later, the color filters CF1, CF2, and CF3 adjacent to each other may partially overlap each other at boundaries where they are in contact with each other. FIG. 6 illustrates a layout of the color filters CF1, CF2, and CF3 viewed from above, and it may be understood that edges of the color filters CF1, CF2, and CF3 disposed below among the color filters CF1, CF2, and CF3 overlapping each other are hidden by the color filters CF1, CF2, and CF3 disposed above the color filters CF1, CF2, and CF3 disposed below. Different color filters CF1, CF2, and CF3 are areas that do not overlap the emission areas EA1, EA2, and EA3, and may overlap each other on a light blocking layer BM to be described later.

In the display device 10, the color filters CF1, CF2, and CF3 are disposed to overlap each other, such that an intensity of the reflected light by the external light may be reduced. Furthermore, a color feeling of the reflected light by the external light may be controlled by adjusting a layout, a shape, areas, and the like, of the color filters CF1, CF2, and CF3 in plan view.

Figure 7:
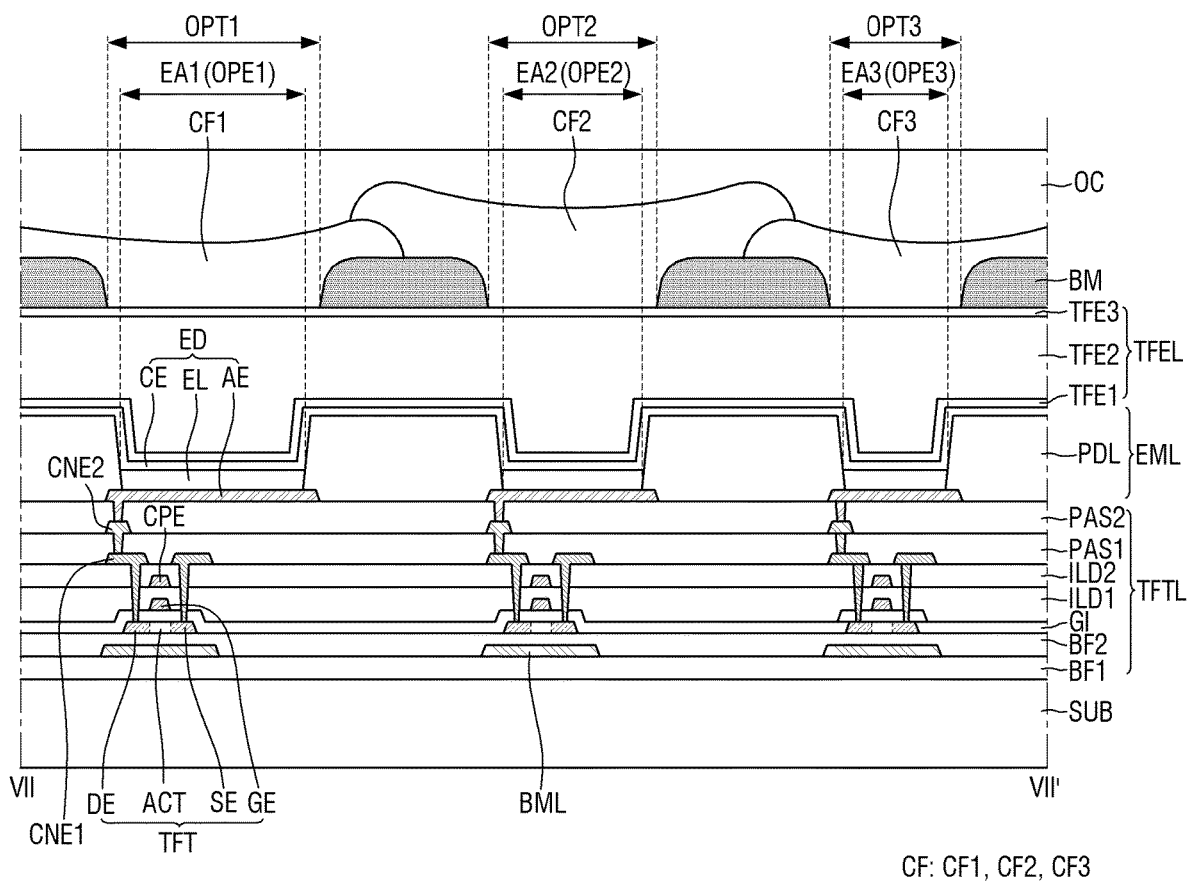
FIG. 7 is a schematic cross-sectional view taken along line VII-VII' of FIG. 5.

FIG. 7 is a schematic cross-sectional view taken along line VII-VII' of FIG. 5. FIG. 7 illustrates a cross-section crossing the first emission area EA1, the second emission area EA2, and the third emission area EA3.

A cross-sectional structure of the display device 10 will be described with reference to FIG. 7 in addition to FIGS. 5 and 6. The display panel 100 of the display device 10 may include a display layer DU and a color filter layer CFL. The display layer DU may include a substrate SUB, a thin film transistor layer TFTL, a light emitting element layer EML, and an encapsulation layer TFEL. The display panel 100 may include a light blocking layer BM disposed on the encapsulation layer TFEL, and the color filters CF1, CF2, and CF3, collectively CF, of the color filter layer CFL may be disposed on the light blocking layer BM.

The substrate SUB may be a base substrate or a base member. The substrate SUB may be a flexible substrate that may be bent, folded, and rolled. As an example, the substrate SUB may include a polymer resin such as polyimide (PI), but is not limited thereto. As another example, the substrate SUB may include a glass material or a metal material.

The thin film transistor layer TFTL may include a first buffer layer BF1, a lower metal layer BML, a second buffer layer BF2, a thin film transistor TFT, a gate insulating layer GI, a first interlayer insulating layer ILD1, a capacitor electrode CPE, a second interlayer insulating layer ILD2, a first connection electrode CNE1, a first passivation layer PAS1, a second connection electrode CNE2, and a second passivation layer PAS2.

The first buffer layer BF1 may be disposed on the substrate SUB. The first buffer layer BF1 may include an inorganic film capable of preventing penetration of air or moisture. For example, the first buffer layer BF1 may include inorganic films that may be alternately stacked each other.

The lower metal layer BML may be disposed on the first buffer layer BF1. For example, the lower metal layer BML may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof.

The second buffer layer BF2 may cover the first buffer layer BF1 and the lower metal layer BML. The second buffer layer BF2 may include an inorganic film capable of preventing penetration of air or moisture. For example, the second buffer layer BF2 may include inorganic films that may be alternately stacked each other.

The thin film transistor TFT may be disposed on the second buffer layer BF2, and may constitute a pixel circuit of each of the pixels. For example, the thin film transistor TFT may be a driving transistor or a switching transistor of the pixel circuit. The thin film transistor TFT may include a semiconductor layer ACT, a source electrode SE, a drain electrode DE, and a gate electrode GE.

The semiconductor layer ACT may be disposed on the second buffer layer BF2. The semiconductor layer ACT may overlap the lower metal layer BML and the gate electrode GE in the thickness direction, and may be insulated from the gate electrode GE by the gate insulating layer GI. A material of the semiconductor layer ACT in portions of the semiconductor layer ACT may become conductors to form the source electrode SE and the drain electrode DE.

The gate electrode GE may be disposed on the gate insulating layer GI. The gate electrode GE may overlap the semiconductor layer ACT with the gate insulating layer GI interposed therebetween.

The gate insulating layer GI may be disposed on the semiconductor layer ACT. For example, the gate insulating layer GI may cover the semiconductor layer ACT and the second buffer layer BF2, and may insulate the semiconductor layer ACT and the gate electrode GE from each other. The gate insulating layer GI may include a contact hole through which the first connection electrode CNE1 penetrates.

The first interlayer insulating layer ILD1 may cover the gate electrode GE and the gate insulating layer GI. The first interlayer insulating layer ILD1 may include a contact hole through which the first connection electrode CNE1 penetrates. The contact hole of the first interlayer insulating layer ILD1 may be connected to the contact hole of the gate insulating layer GI and a contact hole of the second interlayer insulating layer ILD2.

The capacitor electrode CPE may be disposed on the first interlayer insulating layer ILD1. The capacitor electrode CPE may overlap the gate electrode GE in the thickness direction. The capacitor electrode CPE and the gate electrode GE may form a capacitance.

The second interlayer insulating layer ILD2 may cover the capacitor electrode CPE and the first interlayer insulating layer ILD1. The second interlayer insulating layer ILD2 may include the contact hole through which the first connection electrode CNE1 penetrates. The contact hole of the second interlayer insulating layer ILD2 may be connected to the contact hole of the first interlayer insulating layer ILD1 and the contact hole of the gate insulating layer GI.

The first connection electrode CNE1 may be disposed on the second interlayer insulating layer ILD2. The first connection electrode CNE1 may electrically connect the drain electrode DE of the thin film transistor TFT and the second connection electrode CNE2 to each other. The first connection electrode CNE1 may be inserted into the contact holes formed in the second interlayer insulating layer ILD2, the first interlayer insulating layer ILD1, and the gate insulating layer GI to be in contact with the drain electrode DE of the thin film transistor TFT.

The first passivation layer PAS1 may cover the first connection electrode CNE1 and the second interlayer insulating layer ILD2. The first passivation layer PAS1 may protect the thin film transistor TFT. The first passivation layer PAS1 may include a contact hole through which the second connection electrode CNE2 penetrates.

The second connection electrode CNE2 may be disposed on the first passivation layer PAS1. The second connection electrode CNE2 may electrically connect the first connection electrode CNE1 and a pixel electrode AE of a light emitting element ED to each other. The second connection electrode CNE2 may be inserted into the contact hole formed in the first passivation layer PAS1 to be in contact with the first connection electrode CNE1.

The second passivation layer PAS2 may cover the second connection electrode CNE2 and the first passivation layer PAS1. The second passivation layer PAS2 may include a contact hole through which the pixel electrode AE of the light emitting element ED penetrates.

The light emitting element layer EML may be disposed on the thin film transistor layer TFTL. The light emitting element layer EML may include the light emitting element ED and the pixel defining film PDL. The light emitting element ED may include the pixel electrode AE, a light emitting layer EL, and a common electrode CE.

The pixel electrode AE may be disposed on the second passivation layer PAS2. The pixel electrode AE may be disposed to overlap any one of the openings OPE1, OPE2, and OPE3 of the pixel defining film PDL. The pixel electrode AE may be electrically connected to the drain electrode DE of the thin film transistor TFT through the first and second connection electrodes CNE1 and CNE2.

The light emitting layer EL may be disposed on the pixel electrode AE. For example, the light emitting layer EL may be an organic light emitting layer made of an organic material, but is not limited thereto. In case that the light emitting layer EL is the organic light emitting layer, the thin film transistor TFT may apply a given voltage to the pixel electrode AE of the light emitting element ED, and in case that the common electrode CE of the light emitting element ED receives a common voltage or a cathode voltage, holes and electrons may move to the light emitting layer EL through a hole transporting layer and an electron transporting layer, respectively, and may be combined with each other in the light emitting layer EL to emit light.

The common electrode CE may be disposed on the light emitting layer EL. For example, the common electrode CE is not divided for each of the pixels, and may be implemented in the form of an electrode common to all the pixels. The common electrode CE may be disposed on the light emitting layers EL in the first to third emission areas EA1, EA2, and EA3, and may be disposed on the pixel defining film PDL in an area other than the first to third emission areas EA1, EA2, and EA3.

The common electrode CE may receive the common voltage or a low potential voltage. In case that the pixel electrode AE receives a voltage corresponding to a data voltage and the common electrode CE receives the low potential voltage, a potential difference is formed between the pixel electrode AE and the common electrode CE, such that the light emitting layer EL may emit light.

The pixel defining film PDL may include the openings OPE1, OPE2, and OPE3, and may be disposed on the second passivation layer PAS2 and portions of the pixel electrodes AE. The pixel defining film PDL may include the first opening OPE1, the second opening OPE2, and the third opening OPE3, and the respective openings OPE1, OPE2, and OPE3 may expose portions of the pixel electrode AE. As described above, the openings OPE1, OPE2, and OPE3 of the pixel defining film PDL may define the first to third emission areas EA1, EA2, and EA3, respectively, and may have different areas or sizes. The pixel defining film PDL may space and insulate the pixel electrodes AE of light emitting elements ED from each other. The pixel defining film PDL may include a light absorbing material to prevent light reflection. For example, the pixel defining film PDL may include a polyimide (PI)-based binder and a pigment in which red, green, and blue are mixed with each other. As an example, the pixel defining film PDL may include a cardo-based binder resin and a mixture of a lactam black pigment and a blue pigment. As an example, the pixel defining film PDL may include carbon black.

The encapsulation layer TFEL may be disposed on the common electrodes CE to cover the light emitting elements ED. The encapsulation layer TFEL may include at least one inorganic film to prevent oxygen or moisture from permeating into the light emitting element layer EML. The encapsulation layer TFE may include at least one organic film to protect the light emitting element layer EML from foreign materials such as dust.

In an embodiment, the encapsulation layer TFEL may include a first encapsulation layer TFE1, a second encapsulation layer TFE2, and a third encapsulation layer TFE3. The first encapsulation layer TFE1 and the third encapsulation layer TFE3 may be inorganic encapsulation layers, and the second encapsulation layer TFE2 disposed between the first encapsulation layer TFE1 and the third encapsulation layer TFE3 may be an organic encapsulation layer.

Each of the first encapsulation layer TFE1 and the third encapsulation layer TFE3 may include one or more inorganic insulating materials. The inorganic insulating material may include aluminum oxide, titanium oxide, tantalum oxide, hafnium oxide, zinc oxide, silicon oxide, silicon nitride, and/or silicon oxynitride.

The second encapsulation layer TFE2 may include a polymer-based material. The polymer-based material may include an acrylic resin, an epoxy-based resin, polyimide, polyethylene, and the like within the spirit and the scope of the disclosure. For example, the second encapsulation layer TFE2 may include an acrylic resin such as polymethyl methacrylate or polyacrylic acid. The second encapsulation layer TFE2 may be formed by curing a monomer or applying a polymer.

The light blocking layer BM may be disposed on the encapsulation layer TFEL. The light blocking layer BM may include the holes OPT1, OPT2, and OPT3 disposed to overlap the emission areas EA1, EA2, and EA3. For example, a first hole OPT1 may be disposed to overlap the first emission area EA1 or the first opening OPE1. A second hole OPT2 may be disposed to overlap the second emission area EA2 or the second opening OPE2, and a third hole OPT3 may be disposed to overlap the third emission area EA3 or the third opening OPE3. Areas or sizes of the respective holes OPT1, OPT2, and OPT3 may be greater than the areas or the sizes of the openings OPE1, OPE2, and OPE3 of the pixel defining film PDL. The holes OPT1, OPT2, and OPT3 of the light blocking layer BM are formed to be greater than the openings OPE1, OPE2, and OPE3 of the pixel defining film PDL, and thus, the lights emitted from the emission areas EA1, EA2, and EA3 may be viewed by a user not only from a front surface of the display device 10 but also from side surfaces of the display device 10. In an embodiment, a vertical interval between inner sidewalls of the openings OPE1, OPE2, and OPE3 of the pixel defining film PDL and inner sidewalls of the holes OPT1, OPT2 and OPT3 of the light blocking layer BM in plan view may have a size in a range of about 5 µm to about 6 µm or about 5.5 µm. However, the disclosure is not limited thereto. The vertical interval may change depending on a viewing angle required by the display device 10.

The light blocking layer BM may include a light absorbing material. For example, the light blocking layer BM may include an inorganic black pigment or an organic black pigment. The inorganic black pigment may be carbon black, and the organic black pigment may include at least one of lactam black, perylene black, and aniline black, but the disclosure is not limited thereto. The light blocking layer BM may prevent color mixing due to permeation of visible light between the first to third emission areas EA1, EA2, and EA3 to improve a color reproduction range of the display device 10.

The color filters CF1, CF2, and CF3 of the color filter layer CFL may be disposed on the light blocking layer BM. The different color filters CF1, CF2, and CF3 may be disposed to correspond to the different emission areas EA1, EA2, and EA3 or openings OPE1, OPE2, and OPE3 and holes OPT1, OPT2, and OPT3 of the light blocking layer BM, respectively. For example, the first color filter CF1 may be disposed to correspond to the first emission area EA1, the second color filter CF2 may be disposed to correspond to the second emission area EA2, and the third color filter CF3 may be disposed to correspond to the third emission area EA3. The first color filter CF1 may be disposed in the first hole OPT1 of the light blocking layer BM, the second color filter CF2 may be disposed in the second hole OPT2 of the light blocking layer BM, and the third color filter CF3 is disposed in the third hole OPT3 of the light blocking layer BM. Each of the color filters CF1, CF2, and CF3 may be disposed to have a greater area than each of the holes OPT1, OPT2, and OPT3 of the light blocking layer BM in plan view, and some or a number of the color filters CF1, CF2, and CF3 may be directly disposed on the light blocking layer BM.

A planarization layer OC may be disposed on the color filters CF1, CF2, and CF3 to planarize upper ends of the color filters CF1, CF2, and CF3. The planarization layer OC may be a colorless light transmitting layer that does not have a color of a visible light band. For example, the planarization layer OC may include a colorless light transmitting organic material such as an acrylic resin.

According to an embodiment, the color filters CF1, CF2, and CF3 of the display device 10 may be disposed to overlap other color filters CF1, CF2, and CF3 adjacent thereto on the light blocking layer BM. The color filters CF1, CF2, and CF3 disposed on the light blocking layer BM may be disposed so that two color filters CF1, CF2, and CF3 adjacent to each other completely cover the light blocking layer BM. The two color filters CF1, CF2, and CF3 adjacent to each other may be disposed to partially overlap each other on the light blocking layer BM. Such overlap of the color filters CF1, CF2, and CF3 may reduce external light reflection by the light blocking layer BM, and an overlap layout of the color filters CF1, CF2, and CF3 may be designed so as to further reduce the external light reflection.

In the display device 10, the first color filter CF1 and the second color filter CF2 adjacent to each other may be disposed to overlap each other on the light blocking layer BM, and the second color filter CF2 and the third color filter CF3 may also be disposed to overlap each other on the light blocking layer BM. The first color filter CF1 and the third color filter CF3 adjacent to each other may also be disposed to overlap each other on the light blocking layer BM.

According to an embodiment, in the display device 10, the second color filter CF2, which is the green color filter, may be disposed at a level above the first color filter CF1, which is the red color filter, and the third color filter CF3, which is the blue color filter. The third color filter CF3, which is the blue color filter, may be disposed at a level above the first color filter CF1, which is the red color filter. In processes of manufacturing the display device 10, the color filters CF1, CF2, and CF3 may be formed by a photoresist process, and processes for forming the color filters CF1, CF2, and CF3 may be performed in the order of the first color filter CF1, the third color filter CF3, and the second color filter CF2. However, the disclosure is not limited thereto, and in an embodiment, the first color filter CF1, which is the red color filter, may also be disposed at a level above the second color filter CF2 and the third color filter CF3. Processes for forming the color filters CF1, CF2, and CF3 may be performed in the order of the second color filter CF2, the third color filter CF3, and the first color filter CF1. In an embodiment, a width of a portion where two adjacent color filters CF1, CF2, and CF3 overlap each other may be in the range of about 2 µm to about 3 µm or about 2.3 µm. However, the disclosure is not limited thereto, and the width of the portion where the color filters CF1, CF2, and CF3 overlap each other may change depending on a color feeling required by the display device 10.

The light blocking layer BM may include a material absorbing light, but some of the lights incident from the outside may also be reflected by the light blocking layer BM. The color filters CF1, CF2, and CF3 disposed in the holes OPT1, OPT2, and OPT3 of the light blocking layer BM may be partially disposed directly on the light blocking layer BM, and may be disposed to completely cover the light blocking layer BM. The two different color filters CF1, CF2, and CF3 adjacent to each other may include different colorants and may be disposed to overlap each other on the light blocking layer BM, and thus, external light reflection by the light blocking layer BM may be reduced. However, transmissivity of the color filters CF1, CF2, and CF3 may change depending on materials constituting the color filters CF1, CF2, and CF3, and reflection by external light may be more effectively reduced according to the overlap order of the color filters CF1, CF2, and CF3.

The reflection by the external light of the display device 10 may include reflection in the emission areas EA1, EA2, and EA3, reflection in light transmitting areas formed by the holes OPT1, OPT2, and OPT3 of the light blocking layer BM, and reflection in the light blocking layer BM. In case that the sizes of the openings OPE1, OPE2, and OPE3 of the pixel defining film PDL, the sizes of the holes OPT1, OPT2, and OPT3 of the light blocking layer BM, an interval between the openings OPE1, OPE2, OPE3 and the holes OPT1, OPT2, and OPT3, and the like, are adjusted, external light reflection in the emission areas EA1, EA2, and EA3 and the light transmitting area may be controlled. However, in case that the above conditions are controlled, factors related to light efficiency of the display device 10, such as efficiency and a lifespan of the light emitting element ED and side visibility of the display device 10 may be affected. On the other hand, in case that the color filters CF1, CF2, and CF3 are disposed to be overlap each other on the light blocking layer BM, the external light reflection by the light blocking layer BM may be significantly reduced without affecting the light efficiency of the display device 10 described above. By adjusting areas and thicknesses of the color filters CF1, CF2, and CF3 in plan view, widths of overlapping portions of the different color filters CF1, CF2, and CF3, and the like, a color feeling of the reflected light may be controlled to be a color that gives convenience to the user. For example, a color feeling of reflected light in the emission areas EA1, EA2, and EA3 and the light transmitting areas as the reflected light by the external light may be controlled according to the areas of the color filters CF1, CF2, and CF3, and reflected light in the light blocking layer BM as the reflected light by the external light may change depending on an area, a width, or the like, of a portion where the color filters CF1, CF2, and CF3 overlap each other.

In the display device 10, external light incident into the holes OPT1, OPT2, and OPT3 of the light blocking layer BM may be reflected by a material having high reflectivity, such as the pixel electrodes AE and the common electrode CE disposed below the holes OPT1, OPT2, and OPTS. The common electrode CE may be disposed along inclined side surfaces of the pixel defining film PDL on the pixel defining film PDL, and a ratio of external light reflection by the common electrode CE disposed on the pixel defining film PDL may be high. The pixel defining film PDL may include the openings OPE1, OPE2, and OPE3 arranged to be spaced apart from each other at regular intervals, and reflected lights reflected on each side of different openings OPE1, OPE2, and OPE3 may be viewed as a mura having a specific (or given) diffraction pattern according to an arrangement of the openings OPE1, OPE2, and OPE3 while being diffracted and interfering with each other.

Positions at which lights reflected from the common electrode CE of the emission areas EA1, EA2, and EA3 are diffracted and interfere with each other may change depending on the areas or a shape of the emission areas EA1, EA2, and EA3, and the reflected lights may have specific (or given) colors while passing through the color filters CF1, CF2, and CF3. The reflected lights reflected from the common electrode CE disposed in the emission areas EA1, EA2, and EA3 of the same color and emitted through the color filters CF1, CF2, and CF3 may be viewed as a pattern of a specific (or given) color while interfering with each other. In case that the positions at which the reflected lights having different colors are diffracted are adjusted, a color of the diffraction pattern may be controlled.

The display device 10 may have a structure in which a diffraction pattern formed by interference between lights incident from the outside and reflected may be viewed as white. According to an embodiment, in the display device 10, the areas of the openings OPE1, OPE2, and OPE3 of the pixel defining film PDL or the emission areas EA1, EA2, and EA3 may be designed so that the diffraction pattern of the reflected light is viewed as white light. The areas of the openings OPE1, OPE2, and OPE3 of the pixel defining film PDL or the emission areas EA1, EA2, and EA3 may be different from each other, and a ratio between these areas may be related to colors of the lights emitted from the different emission areas EA1, EA2, and EA3 or colors of the color filters CF1, CF2, and CF3. Hereinafter, an area ratio between the openings OPE1, OPE2, and OPE3 of the pixel defining film PDL or the emission areas EA1, EA2, and EA3 will be described with reference to other drawings.

Figure 8:
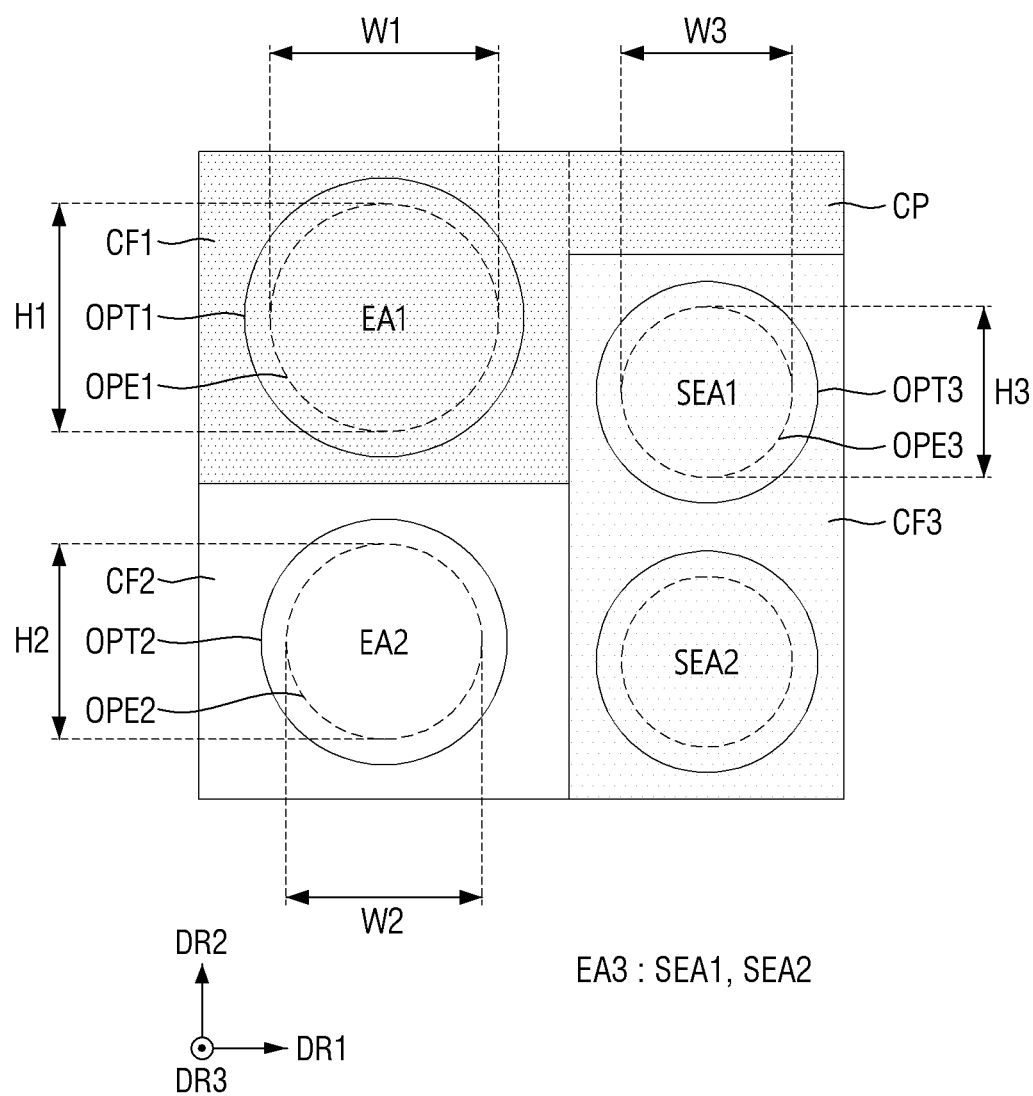
FIG. 8 is a schematic plan view illustrating a layout of emission areas of one pixel of FIG. 5.

FIG. 8 is a schematic plan view illustrating a layout of emission areas of one pixel of FIG. 5. FIG. 8 illustrates a shape, in plan view, of the emission areas EA1, EA2, and EA3 disposed in the first pixel PX1 of FIG. 5.

Referring to FIG. 8, the display device 10 may include the emission areas EA1, EA2, and EA3 disposed for each of the pixels PX1, PX2, PX3, and PX4, and the respective emission areas EA1, EA2, and EA3 may be defined by the openings OPE1, OPE2, and OPE3 of the pixel defining film PDL, respectively.

In the first emission area EA1 or the first opening OPE1, a light emitting element ED emitting light of a first color may be disposed, and red light, which is the light of the first color, may be emitted. In the second emission area EA2 or the second opening OPE2, a light emitting element ED emitting light of a second color may be disposed, and green light, which is the light of the second color, may be emitted. In the sub-emission areas SEA1 and SEA2 of the third emission area EA3 or the third opening OPE3, a light emitting element ED emitting light of a third color may be disposed, and blue light, which is the light of the third color, may be emitted. Light emitting elements ED including the same pixel electrode AE may be disposed in the first sub-emission area SEA1 and the second sub-emission area SEA2. The area of each of the first emission area EA1, the second emission area EA2, and the sub-emission areas SEA1 and SEA2 of the third emission area EA3 may have a ratio similar to a wavelength band of light emitted from each of the first emission area EA1, the second emission area EA2, and the sub-emission areas SEA1 and SEA2 of the third emission area EA3.

According to an embodiment, the first emission area EA1 emitting the red light, which is the light of the first color, may have a greater area than other emission areas emitting the light of the second color or the light of the third color. The first emission area EA1 may have a greater area than the second emission area EA2 and the sub-emission areas SEA1 and SEA2 of the third emission area EA3. The second emission area EA2 from which the green light corresponding to the light of the second color is emitted may have a greater area than the sub-emission areas SEA1 and SEA2 of the third emission area EA3 from which the light of the third color is emitted. The second emission area EA2 may have an area greater than an area of each of the first sub-emission area SEA1 and the second sub-emission area SEA2. The area of the second emission area EA2 may be greater or smaller than the sum of the areas of the first sub-emission area SEA1 and the second sub-emission area SEA2.

Since the emission areas EA1, EA2, and EA3 are defined by the openings OPE1, OPE2, and OPE3 of the pixel defining film PDL, an area ratio between the openings OPE1, OPE2, and OPE3 may also be similar to that described above. The first opening OPE1 may have a greater area than the other openings OPE2 and OPE3. The second opening OPE2 may have a greater area than each of the third openings OPE3. The area of the second opening OPE2 may be greater or smaller than the sum of the areas of the third openings OPE3 of the first sub-emission area SEA1 and the second sub-emission area SEA2.

Each of the sub-emission areas SEA1 and SEA2 of the third emission area EA3 emits the blue light, which is the light of the third color, and may thus have a relatively small area. In case that the third emission area EA3 may include one third opening OPE3, an intensity of the blue light in one pixel PX1, PX2, PX3, or PX4 may be insufficient or a lifespan of the light emitting element ED of the third emission area EA3 may be insufficient. In order to prevent such a problem, the sub-emission areas SEA1 and SEA2 may constitute one third emission area EA3 by forming third openings OPE3 having a relatively small area in one pixel PX1, PX2, PX3, or PX4. In the display device 10, according to the areas of the emission areas EA1, EA2, and EA3 from which lights of different colors are emitted, a specific (or given) emission area (for example, the third emission area EA3) may include one or more sub-emission areas SEA1 and SEA2 per unit pixel PX1, PX2, PX3, or PX4.

As described above, the lights reflected and diffracted from the common electrode CE disposed on the inclined surfaces of the pixel defining film PDL among the lights incident on the display device 10 from the outside may interfere with each other at specific (or given) positions according to the areas of the emission areas EA1, EA2, and EA3 or the openings OPE1, OPE2, and OPE3 of the pixel defining film PDL to be viewed as a specific (or given) pattern. The emission areas EA1, EA2, and EA3 may be disposed in the display area DA, and the lights reflected from the common electrode CE disposed in the emission areas EA1, EA2, and EA3 different from each other may interfere with other lights having the same phase to be viewed as a mura having a specific (or given) diffraction pattern. The reflected lights may be viewed as patterns of specific (or given) colors according to colors of the emission areas EA1, EA2, and EA3 from which they are reflected or the color filters CF1, CF2, and CF3 through which they pass. For example, the light reflected from the common electrode CE disposed on the pixel defining film PDL in the first emission area EA1 may pass through the first color filter CF1 to have a red color. For example, a color of the reflected light in which the diffraction occurs may be different depending on the color filters CF1, CF2, and CF3, and a position of the reflected light in which the diffraction occurs may be different depending on a wavelength band of the reflected light and the areas of the emission areas EA1, EA2, and EA3 or the openings OPE1, OPE2, and OPE3 of the pixel defining film PDL.

Lights of different wavelength bands may be mixed in white light incident from the outside, and in case that these lights are reflected and diffracted, positions at which these lights are diffracted may be proportional to wavelengths. For example, reflected lights having the same wavelength band as the blue light may be positioned more adjacent to the center of the diffraction pattern than reflected lights having the same wavelength band as the green light and the red light. Reflected lights having the same wavelength band as the green light may be positioned more adjacent to the center of the diffraction pattern than reflected lights having the same wavelength band as the red light. In the diffraction pattern formed by the lights reflected and diffracted from the emission areas EA1, EA2, and EA3, patterns of the blue light, the green light, and the red light may be positioned from the center toward the outside.

As an example, the positions at which the reflected lights are diffracted may be inversely proportional to diameters or the area of the emission areas EA1, EA2, and EA3. In case that light of the same wavelength band is reflected, a position of the diffraction pattern may be shifted inward as the diameters or the areas of the emission areas EA1, EA2, and EA3 increase. As described above, the lights reflected and diffracted from the different emission areas EA1, EA2, and EA3 may have different colors according to the colors of the color filters CF1, CF2, and CF3. The positions at which the reflected lights are diffracted may change depending on wavelength bands of the reflected and diffracted lights, but the positions at which the reflected lights are diffracted may be controlled by designing the emission areas EA1, EA2, and EA3 so as to have different diameters or areas. For example, in case that a diameter of the first emission area EA1 in which reflected light of the red light is diffracted is greater than a diameter of the third emission area EA3 in which reflected light of the blue light is diffracted, a position at which the reflected light of the red light is diffracted may be shifted inward in the diffraction pattern, and may overlap a position at which the reflected light of the blue light is diffracted. In case that positions at which reflected lights of different wavelength bands are diffracted overlap each other at a specific (or given) position, the diffraction pattern may have a white color.

In the display device 10 according to an embodiment, the area ratio between of the emission areas EA1, EA2, and EA3 may be designed so that a pattern having a specific (or given) color due to the reflection and the diffraction of the lights from the emission areas EA1, EA2, and EA3 may be viewed as a white pattern. The positions at which the diffraction of the lights reflected from the common electrode CE occurs may change depending on the areas of the emission areas EA1, EA2, and EA3, and in case that reflected lights of different colors are diffracted at the same position, a mixed light of the diffracted lights may have a white color. Since the colors of the color filters CF1, CF2, and CF3 are the same as the colors of the lights emitted from the emission areas EA1, EA2, and EA3, respectively, the areas of the emission areas EA1, EA2, and EA3 or the opening OPE1, OPE2, and OPE3 of the pixel defining film PDL may be related to the colors of the lights emitted from the emission areas EA1, EA2, and EA3 or the wavelength bands of the lights.

According to an embodiment, in the display device 10, a ratio between opening widths W1, W2, and W3 or opening lengths H1, H2, and H3 of the different emission areas EA1, EA2, and EA3 may change depending on the wavelength bands of the lights emitted from the different emission areas EA1, EA2, and EA3. For example, the red light, which is the light of the first color, may be emitted from the first emission area EA1, and a first opening width W1 or a first opening length H1 of the first emission area EA1 may be greater than the opening widths W2 and W3 or the opening lengths H2 and H3 of the second emission area EA2 and the third emission area EA3 from which lights having a shorter wavelength band than the red light corresponding to the light of the first color are emitted. The first opening width W1 or the first opening length H1 of the first emission area EA1 may be greater than the opening widths W2 and W3 or the opening lengths H2 and H3 of the second emission area EA2 from which the green light corresponding to the light of the second color is emitted and each of the sub-emission areas SEA1 and SEA2 of the third emission area EA3 from which the blue light corresponding to the light of the third color is emitted. A second opening width W2 or a second opening length H2 of the second emission area EA2 may be greater than a third opening width W3 or a third opening length H3 of the third emission area EA3 from which light having a shorter wavelength band than the green light corresponding to the light of the second color is emitted. The second opening width W2 or the second opening length H2 of the second emission area EA2 may be greater than the third opening width W3 or the third opening length H3 of each of the sub-emission areas SEAL and SEA2 of the third emission area EA3 from which the blue light corresponding to the light of the third color is emitted. In an embodiment, a ratio between the opening widths W1, W2, and W3 or the opening lengths H1, H2, and H3 of the first emission area EA1, the second emission area EA2, and the third emission area EA3 or the sub-emission areas SEA1 and SEA2 of the third emission area EA3 may be 1.33:1.15:1 to 1.43:1.25:1. In an embodiment, a ratio between the opening widths W1, W2, and W3 or the opening lengths H1, H2, and H3 of the first emission area EA1, the second emission area EA2, and the third emission area EA3 or the sub-emission areas SEA1 and SEA2 of the third emission area EA3 may be 1.38: 1.17:1 to 1. However, the disclosure is not limited thereto, and a numerical value of the ratio between the emission areas EA1, EA2, and EA3 may be variously designed.

In the display device 10, each of the emission areas EA1, EA2, and EA3 may have a circular shape. The respective emission areas EA1, EA2, and EA3 or the openings OPE1, OPE2, and OPE3 of the pixel defining film PDL may have the opening widths W1, W2, and W3 measured in the first direction DR1 and the opening lengths H1, H2, and H3 measured in the second direction DR2, respectively. In an embodiment in which each of the emission areas EA1, EA2, and EA3 has the circular shape, ratios of the opening lengths H1, H2, and H3 to the opening widths W1, W2, and W3 of the respective emission areas EA1, EA2, and EA3 may be the same as each other. For example, a ratio of the opening lengths H1, H2, and H3 to the opening widths W1, W2, and W3 of the first emission area EA1, the second emission area EA2, and the third emission area EA3 or the sub-emission areas SEA1 and SEA2 of the third emission area EA3 may be 1:1. However, the disclosure is not limited thereto, and values of the opening lengths H1, H2, and H3 as compared to the opening widths W1, W2, and W3 may change depending on a shape of the emission areas EA1, EA2, and EA3 or the openings OPE1, OPE2, and OPE3 of the pixel defining film PDL.

Similar to the ratio between the opening widths W1, W2, and W3 or the opening lengths H1, H2, and H3 of the respective emission areas EA1, EA2, and EA3 changing depending on the wavelengths of the lights emitted from the respective emission areas EA1, EA2, and EA3, a ratio between the areas of the respective emission areas EA1, EA2, and EA3 may also change depending on the wavelengths of the lights emitted from the respective emission areas EA1, EA2, and EA3. For example, the area of the first emission area EA1 may be greater than the area of the second emission area EA2 and the area of each of the sub-emission areas SEA1 and SEA2 of the third emission area EA3. The area of the second emission area EA2 may be greater than the area of each of the sub-emission areas SEA1 and SEA2 of the third emission area EA3.

In an embodiment, the areas of the emission areas EA1, EA2, and EA3 rather than the ratio between the opening widths W1, W2, and W3 or the opening lengths H1, H2, and H3 may have a specific (or given) ratio. For example, the area of the first emission area EA1, the area of the second emission area EA2, and the area of the third emission area EA3 may have a ratio of $1.33^2:1.15^2:1^2$ to $1.43^2:1.25^2:1^2$ therebetween. In an embodiment, the area of the first emission area EA1, the area of the second emission area EA2, and the area of the third emission area EA3 may have a ratio of $1.38^2:1.17^2:1^2$ therebetween.

As described above, the display device 10 may include the holes OPT1, OPT2, and OPT3 of the light blocking layer BM disposed to overlap the emission areas EA1, EA2, and EA3 or the openings OPE1, OPE2, and OPE3 of the pixel defining film PDL, respectively. In an embodiment, vertical distances between sidewalls of the openings OPE1, OPE2, and OPE3 of the pixel defining film PDL and sidewalls of the holes OPT1, OPT2, and OPT3 of the light blocking layer BM in plan view may be constant regardless of the emission area EA1, EA2, and EA3 or the openings OPE1, OPE2, and OPE3. Accordingly, an area ratio between the holes OPT1, OPT2, and OPT3 of the light blocking layer BM or a ratio between opening widths or opening lengths of the holes OPT1, OPT2, and OPT3 may also be similar to the area ratio between the emission areas EA1, EA2, and EA3 or the ratio between the opening widths or the opening lengths of the emission areas EA1, EA2, and EA3.

For example, an area of the first hole OPT1 overlapping the first emission area EA1 may be greater than areas of the second hole OPT2 overlapping the second emission area EA2 and the third holes OPT3 overlapping the sub-emission areas SEA1 and SEA2 of the third emission area EA3. The area of the second hole OPT2 overlapping the second emission area EA2 may be greater than the areas of the third holes OPT3 overlapping the sub-emission areas SEA1 and SEA2 of the third emission area EA3. As an example, an opening width and an opening length of the first hole OPT1 may be greater than an opening width and an opening length of the second hole OPT2 and an opening width and an opening length of the third hole OPT3. The opening width and the opening length of the second hole OPT2 may be greater than the opening width and the opening length of the third hole OPT3.

However, a ratio between the areas, widths, or lengths of the color filters CF1, CF2, and CF3 disposed to overlap the emission areas EA1, EA2, and EA3 may be unrelated to the wavelength bands of the lights emitted from the emission areas EA1, EA2, and EA3, or the colors of the respective color filters CF1, CF2, and CF3. For example, the first color filter CF1 may be a red color filter of the first color and the second color filter CF2 may be a green color filter of the second color, but an area of the first color filter CF1 may not necessarily be greater than an area of the second color filter CF2. The third color filter CF3 may be a blue color filter of the third color, but may have a greater area than the first color filter CF1 and the second color filter CF2. In an embodiment, the area ratio between the different emission areas EA1, EA2, and EA3 and a magnitude relationship of the areas of the different emission areas EA1, EA2, and EA3 may be different from the area ratio between the different color filters CF1, CF2, and CF3 and a magnitude relationship of the areas of the different color filters CF1, CF2, and CF3. For example, a ratio between the opening widths W1, W2, and W3 or the opening lengths H1, H2, and H3 of the first emission area EA1, the second emission area EA2, and the sub-emission areas SEA1 and SEA2 of the third emission area EA3 is the ratio described above, while widths, lengths, or areas of the first color filter CF1, the second color filter CF2, and the third color filter CF3 may have a ratio different from the ratio described above therebetween. In an embodiment in which the color pattern CP may include the same material or a similar material as the first color filter CF1, which is the red color filter, to be integrated with the first color filter CF1, an area ratio of the red color filter in an area ratio between the first color filter CF1 and the color pattern CP, the second color filter CF2, and the third color filter CF3 may be relatively great.

However, the disclosure is not limited thereto. In an embodiment, a width, length, or area ratio between the first color filter CF1, the second color filter CF2, and the third color filter CF3 may be the same as the ratio between the opening widths W1, W2, and W3 or the opening lengths H1, H2, and H3 of the first emission area EA1, the second emission area EA2, and the sub-emission areas SEA1 and SEA2 of the third emission area EA3 or the area ratio between the first emission area EA1, the second emission area EA2, and the sub-emission areas SEA1 and SEA2 of the third emission area EA3.

In the display device 10 according to an embodiment, the areas of the emission areas EA1, EA2, and EA3 or the openings OPE1, OPE2, and OPE3 of the pixel defining film PDL may be different from each other according to the wavelength bands of the emitting lights, and may have a specific (or given) area ratio therebetween. Accordingly, the diffraction pattern generated by the external light reflected from the emission areas EA1, EA2, and EA3 may have a white color, and even though the diffraction pattern of the reflected light by the external light is viewed, the diffraction pattern may not have a specific (or given) color. Even though the user uses the display device 10 in an outdoor environment in which the external light is strong, a mura due to the external light in the display device 10 may have a white color, and the display device 10 may provide the user with a convenient use feeling.

In an embodiment of FIGS. 5 to 8, a case where the emission areas EA1, EA2, and EA3 of the display device 10 have the circular shape and the ratio of the opening lengths H1, H2, and H3 to the opening widths W1, W2, and W3 is 1:1 has been illustrated. However, the disclosure is not limited thereto. The diffraction pattern formed by the diffraction of the lights reflected in the display device 10 may change depending on the shape and the layout of the emission areas EA1, EA2, and EA3, and the display device 10 may have a structure in which the diffraction pattern is designed so as to be hardly viewed by the user. This will be described with reference to other embodiments.

Figure 9:
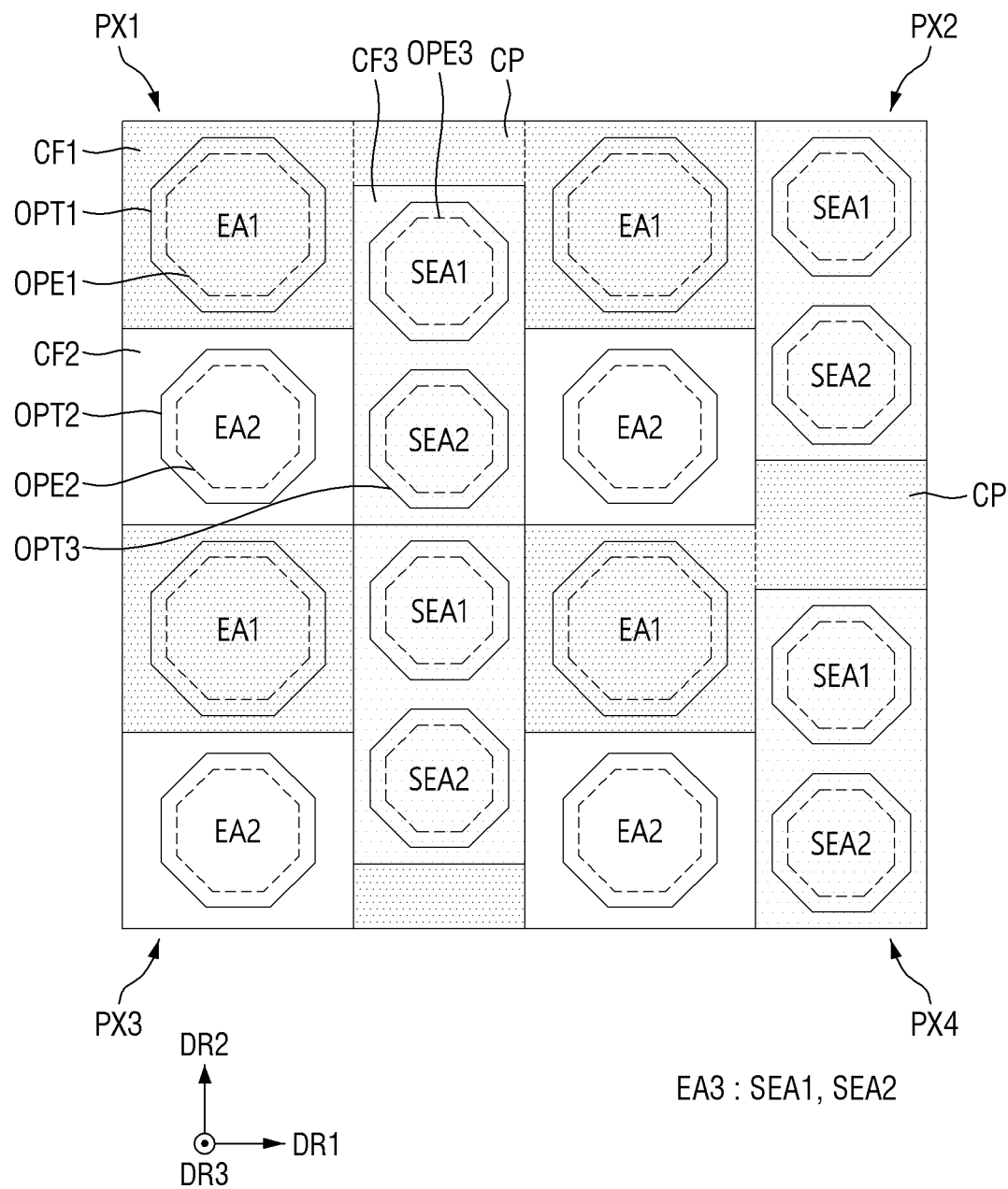
FIG. 9 is a schematic plan view illustrating emission areas disposed in a display area of a display device according to an embodiment.
Figure 10:
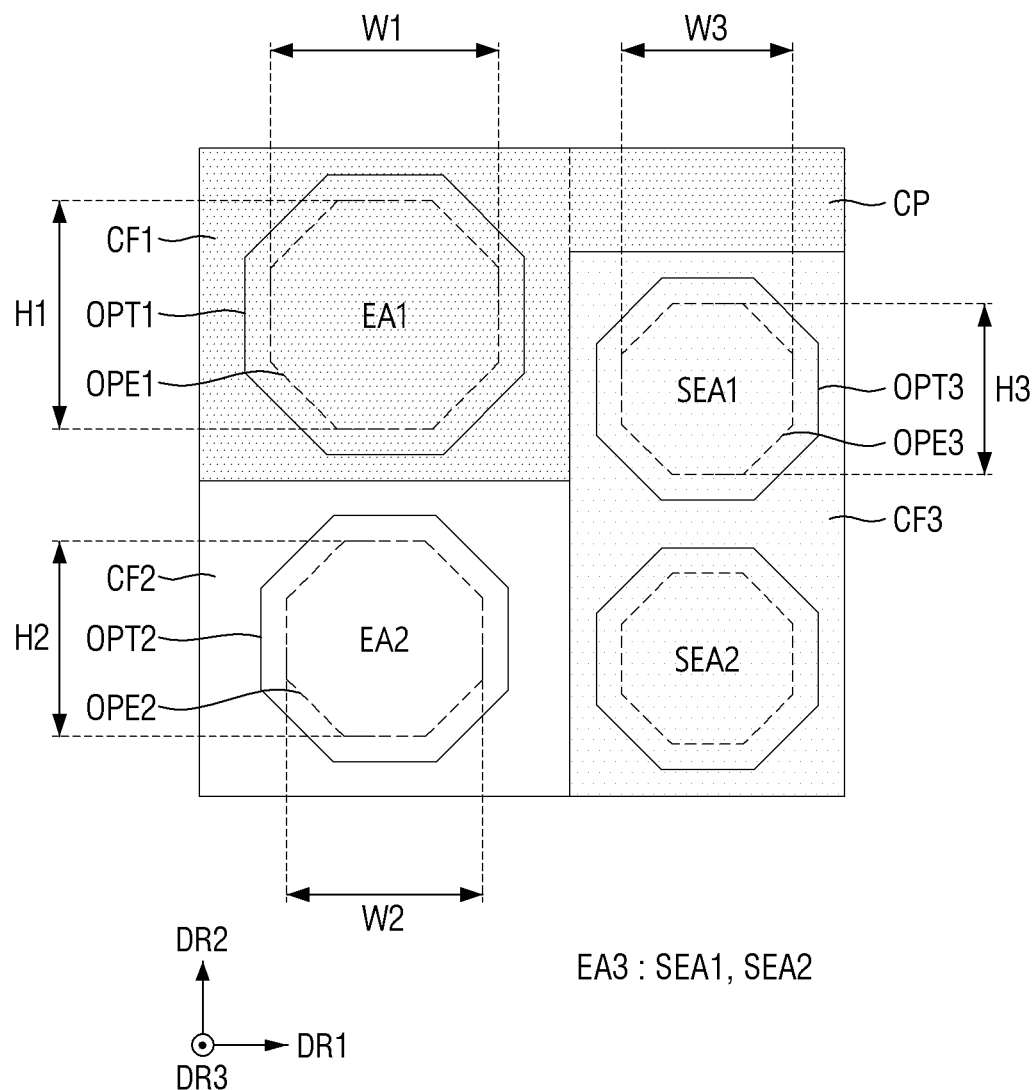
FIG. 10 is a schematic plan view illustrating emission areas disposed in one pixel of FIG. 9.

FIG. 9 is a schematic plan view illustrating emission areas disposed in a display area of a display device according to an embodiment. FIG. 10 is a schematic plan view illustrating emission areas disposed in one pixel of FIG. 9.

Referring to FIGS. 9 and 10, in a display device 10 according to an embodiment, the emission areas EA1, EA2, and EA3 or the openings OPE1, OPE2, and OPE3 of the pixel defining film PDL may have a polygonal shape. As an example, the emission areas EA1, EA2, and EA3 or the openings OPE1, OPE2, and OPE3 of the pixel defining film PDL may have a regular octagonal shape. The embodiment is the same as an embodiment of FIGS. 5 to 8 except for the shape of the respective emission areas EA1, EA2, and EA3 or the openings OPE1, OPE2, and OPE3 of the pixel defining film PDL. Hereinafter, a description of overlapping contents will be omitted and contents different from those described above will be described.

Lights reflected in the display device 10 may interfere with adjacent reflected light to be viewed as a specific (or given) pattern. In the display area DA, emission areas EA1, EA2, and EA3 may be disposed for each of the pixels PX1, PX2, PX3, and PX4, and positions at which reflected lights reflected from the emission areas EA1, EA2, and EA3 of different pixels PX1, PX2, PX3, and PX4 interfere with each other and a shape of a diffraction pattern may change depending on the shape of the emission areas EA1, EA2, and EA3. In an embodiment in which the emission areas EA1, EA2, and EA3, or the openings OPE1, OPE2, and OPE3 of the pixel defining film PDL have a circular shape as in an embodiment of FIGS. 5 to 8, the diffraction pattern formed by the reflected light of the external light may have a circular shape. In the display device 10, the shape of the emission areas EA1, EA2, and EA3 or the openings OPE1, OPE2, and OPE3 of the pixel defining film PDL may be designed so that the diffraction pattern is relatively unclear.

As sides of the emission areas EA1, EA2, and EA3 or the openings OPE1, OPE2, and OPE3 of the pixel defining film PDL are closer to a linear shape, the diffraction pattern formed by the reflected light may be viewed as a specific (or given) pattern along positions of the sides close to the linear shape. In an embodiment in which the emission areas EA1, EA2, and EA3, or the openings OPE1, OPE2, and OPE3 of the pixel defining film PDL have the polygonal shape, respective sides of a polygon may extend in various directions, and as lengths of the respective sides are shorter, diffraction of the reflected light may be dispersed, such that the diffraction pattern may be unclear. In the display device 10 according to an embodiment, the emission areas EA1, EA2, and EA3 or the openings OPE1, OPE2, and OPE3 of the pixel defining film PDL may have the polygonal shape, and may have a shape of which respective sides may have a small length and may extend in various directions, for example, an octagonal shape.

Also in an embodiment of FIG. 10, as described above, the area ratio between the emission areas EA1, EA2, and EA3 may be designed according to the wavelength bands of the lights emitted from the emission areas EA1, EA2, and EA3. For example, the area of the first emission area EA1 may be greater than the area of the second emission area EA2 and the area of each of the sub-emission areas SEA1 and SEA2 of the third emission area EA3. The area of the second emission area EA2 may be greater than the area of each of the sub-emission areas SEA1 and SEA2 of the third emission area EA3. The respective emission areas EA1, EA2, and EA3 may have a regular octagonal shape, and a ratio of the opening lengths H1, H2, and H3 to the opening widths W1, W2, and W3 of the respective emission areas EA1, EA2, and EA3 may be 1:1. However, the disclosure is not limited thereto, and in an embodiment, the respective emission areas EA1, EA2, and EA3 may have an octagonal shape, and a ratio of the opening lengths H1, H2, and H3 to the opening widths W1, W2, and W3 of the respective emission areas EA1, EA2, and EA3 may not be 1:1. In the display device 10, the color of the diffraction pattern by the reflected light is white, and the diffraction of the reflected light is dispersed, such that the diffraction pattern may be unclearly viewed.

Figure 11:
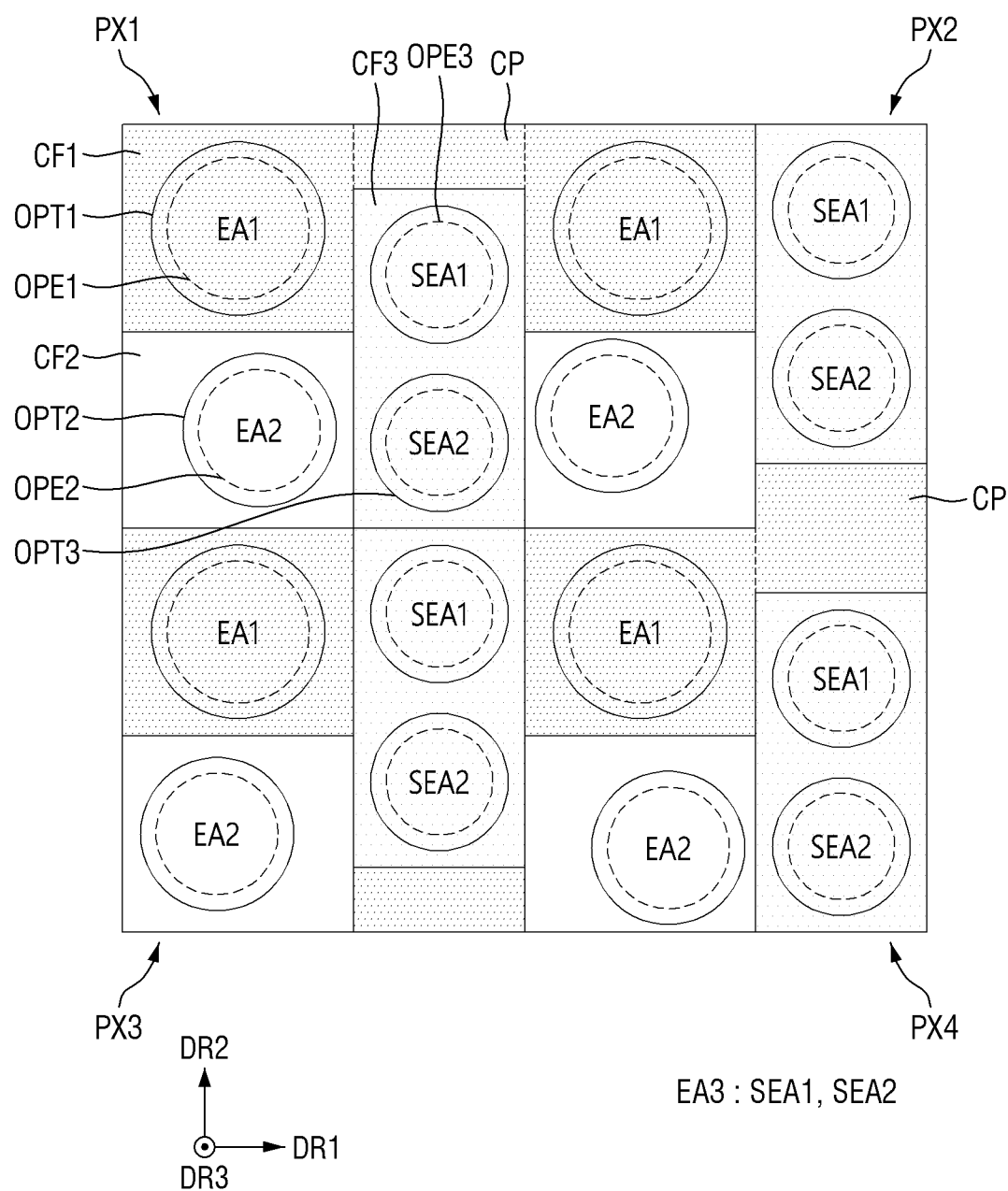
FIG. 11 is a schematic plan view illustrating emission areas disposed in a display area of a display device according to an embodiment.
Figure 12:
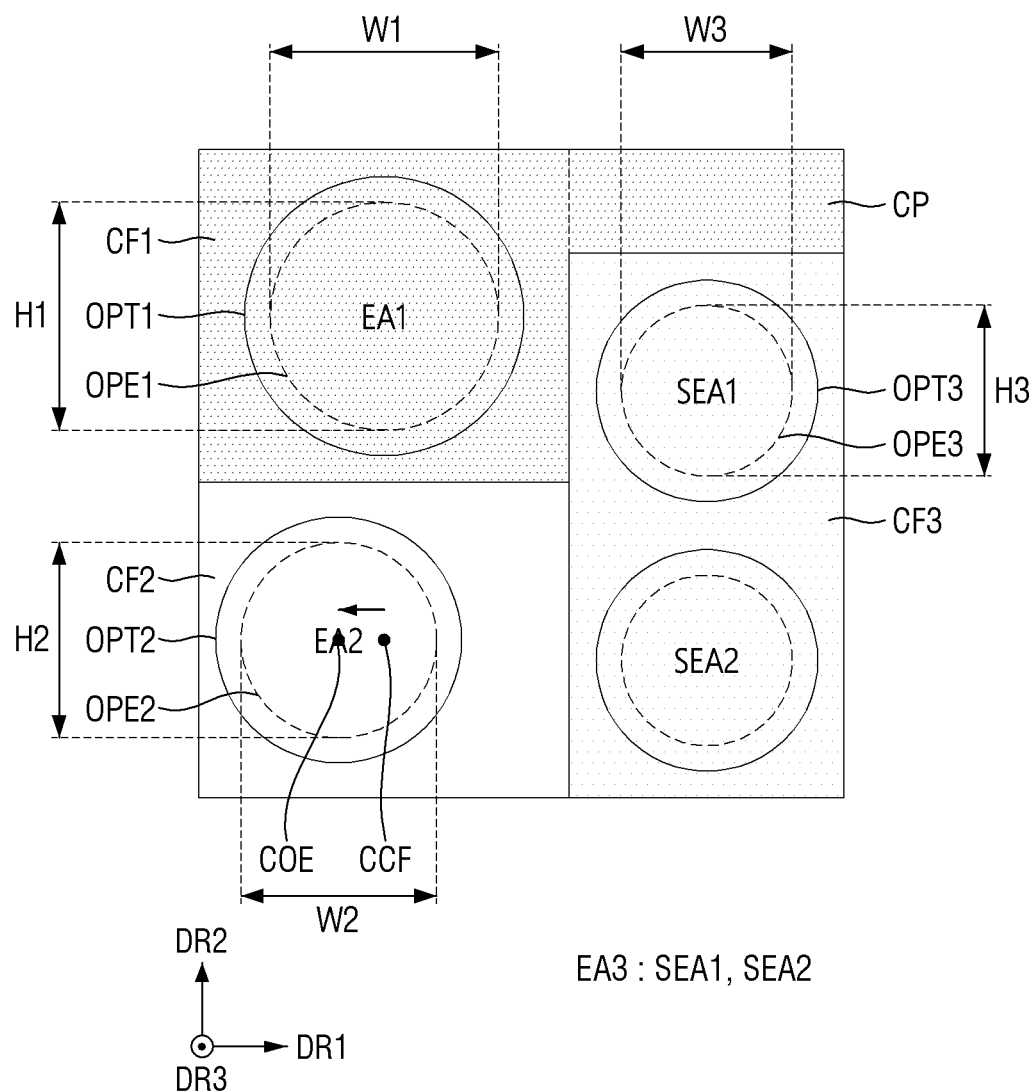
FIG. 12 is a schematic plan view illustrating emission areas disposed in one pixel of FIG. 11.

FIG. 11 is a schematic plan view illustrating emission areas disposed in a display area of a display device according to an embodiment. FIG. 12 is a schematic plan view illustrating emission areas disposed in one pixel of FIG. 11.

Referring to FIGS. 11 and 12, in a display device 10 according to an embodiment, the emission areas EA1, EA2, and EA3 may overlap the color filters CF1, CF2, and CF3, respectively, but centers COE of the emission areas EA1, EA2, and EA3 may not coincide with centers CCF of the color filters CF1, CF2, and CF3. As described above, in the display device 10, the lights reflected and diffracted from the emission areas EA1, EA2, and EA3 may interfere with lights reflected and diffracted from other emission areas EA1, EA2, and EA3 to be viewed as a specific (or given) pattern. Positions at which the diffracted lights interfere with each other may change depending on the areas of the emission areas EA1, EA2, and EA3, but may also change depending on positions of the emission areas EA1, EA2, and EA3 themselves. In the display device 10 according to an embodiment, interference of the lights reflected and diffracted from other adjacent emission areas EA1, EA2, and EA3 may be weakened by shifting the positions of the emission areas EA1, EA2, and EA3 with respect to the color filters CF1, CF2, and CF3.

In an embodiment of FIGS. 11 and 12, a case where a position of the second emission area EA2 is shifted with respect to the second color filter CF2 has been illustrated. The second emission area EA2 may be disposed at a position in which a center COE thereof is shifted from a center CCF of the second color filter CF2 in a specific (or given) direction, and a shifted direction or degree of the emission areas EA1, EA2, and EA3 may be different for each of the pixels PX1, PX2, PX3, and PX4. For example, in the first pixel PX1, the center COE of the second emission area EA2 may be shifted from the center CCF of the second color filter CF2 in a right direction, which is the first direction DR1, and in the third pixel PX3, the center COE of the second emission area EA2 may be shifted from the center CCF of the second color filter CF2 in a left direction, which is a direction opposite to the first direction DR1. In the second pixel PX2, the center COE of the second emission area EA2 may be shifted from the center CCF of the second color filter CF2 in a diagonal direction between the direction opposite to the first direction DR1 and the second direction DR2, and in the fourth pixel PX4, the center COE of the second emission area EA2 may be shifted from the center CCF of the second color filter CF2 in a diagonal direction between the first direction DR1 and a direction opposite to the second direction DR2. Accordingly, the lights reflected and diffracted from the second emission areas EA2 of the different pixels PX1, PX2, PX3, and PX4 may hardly interfere with each other, and an intensity of the green light in the diffraction pattern by the reflected and diffracted light may be weak. Accordingly, the areas of the first emission area EA1 and the third emission area EA3 may be partially adjusted so that the color of the diffraction pattern is white. Although not illustrated in the drawings, in addition to the second emission area EA2, positions of the first emission area EA1 and the sub-emission areas SEA1 and SEA2 of the third emission area EA3 may also be shifted with respect to the color filters CF1, CF2, and CF3, respectively. In the display device 10 according to an embodiment, the color and the intensity of the diffraction pattern by the reflected light may be controlled by shifting the emission areas EA1, EA2, and EA3.

Figure 13:
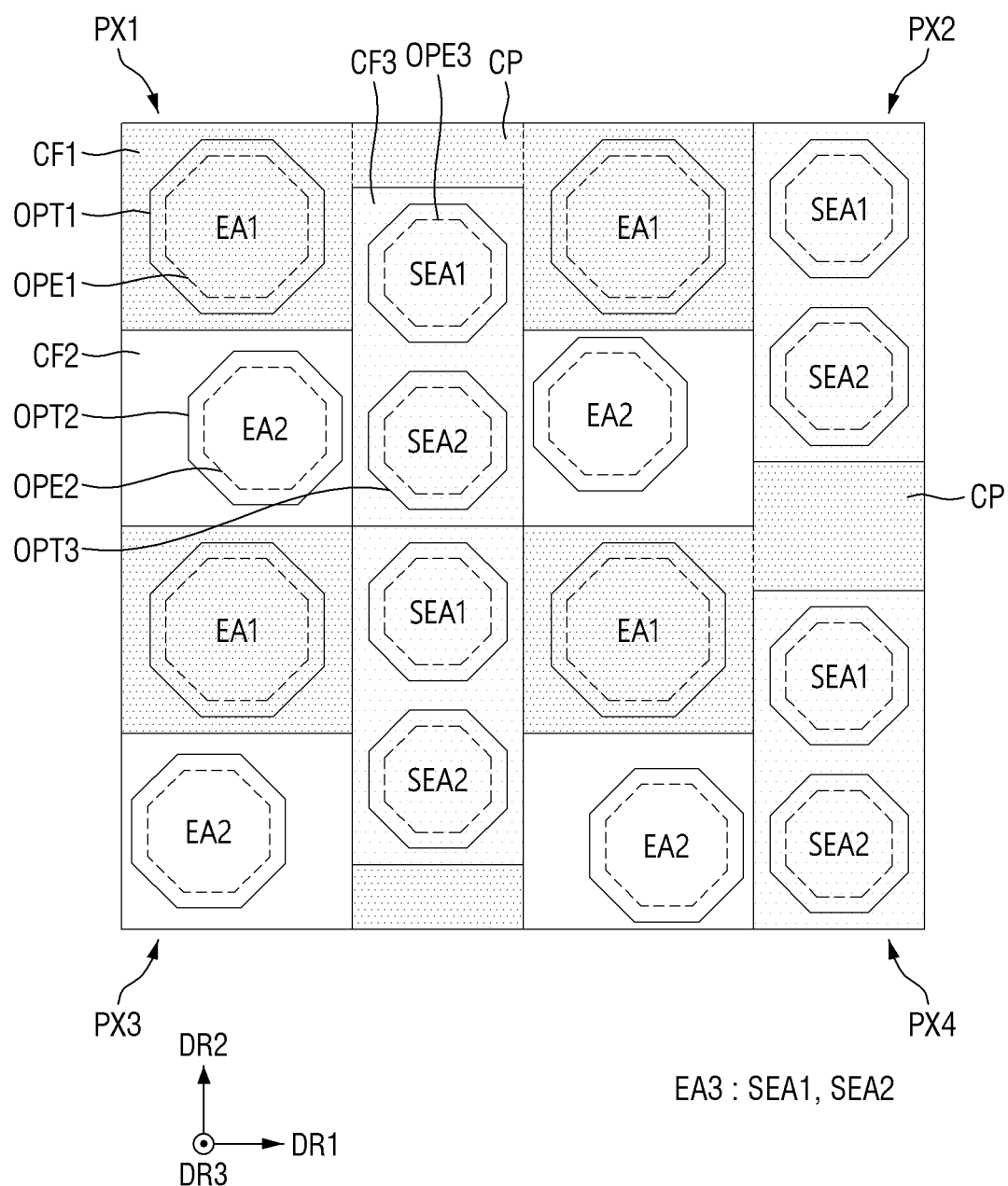
FIG. 13 is a schematic plan view illustrating emission areas disposed in a display area of a display device according to an embodiment.
Figure 14:
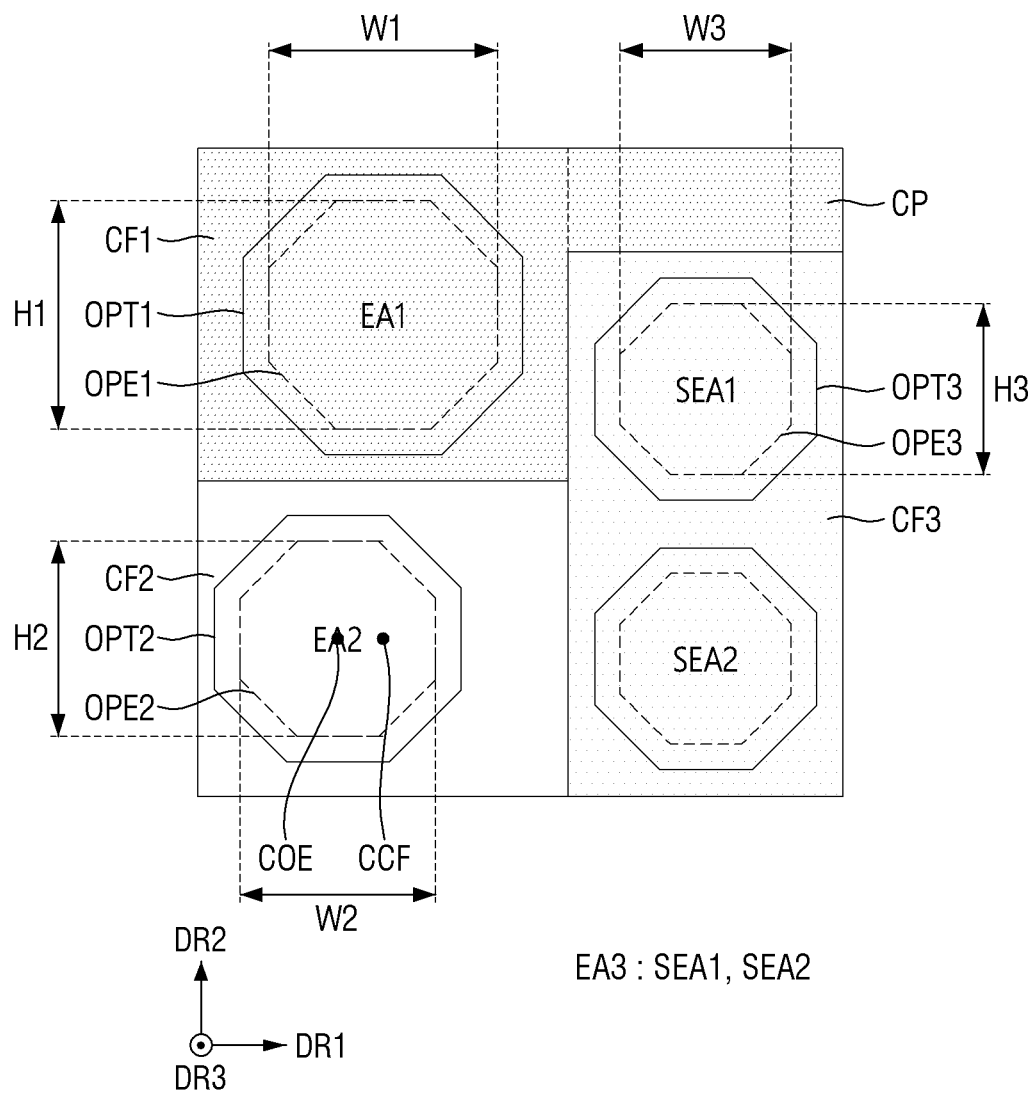
FIG. 14 is a schematic plan view illustrating emission areas disposed in one pixel of FIG. 11.

FIG. 13 is a schematic plan view illustrating emission areas disposed in a display area of a display device according to an embodiment. FIG. 14 is a schematic plan view illustrating emission areas disposed in one pixel of FIG. 13.

Referring to FIGS. 13 and 14, in a display device 10 according to an embodiment, the respective emission areas EA1, EA2, and EA3 or the openings OPE1, OPE2, and OPE3 of the pixel defining film PDL may have a regular octagonal shape in plan view, and the emission areas EA1, EA2, and EA3 may overlap the color filters CF1, CF2, and CF3, respectively, but centers COE of the emission areas EA1, EA2, and EA3 may not coincide with centers CCF of the color filters CF1, CF2, and CF3. The embodiment is the same as a combination of embodiments of FIGS. 9 and 11, and an overlapping description will thus be omitted.

Figure 15:
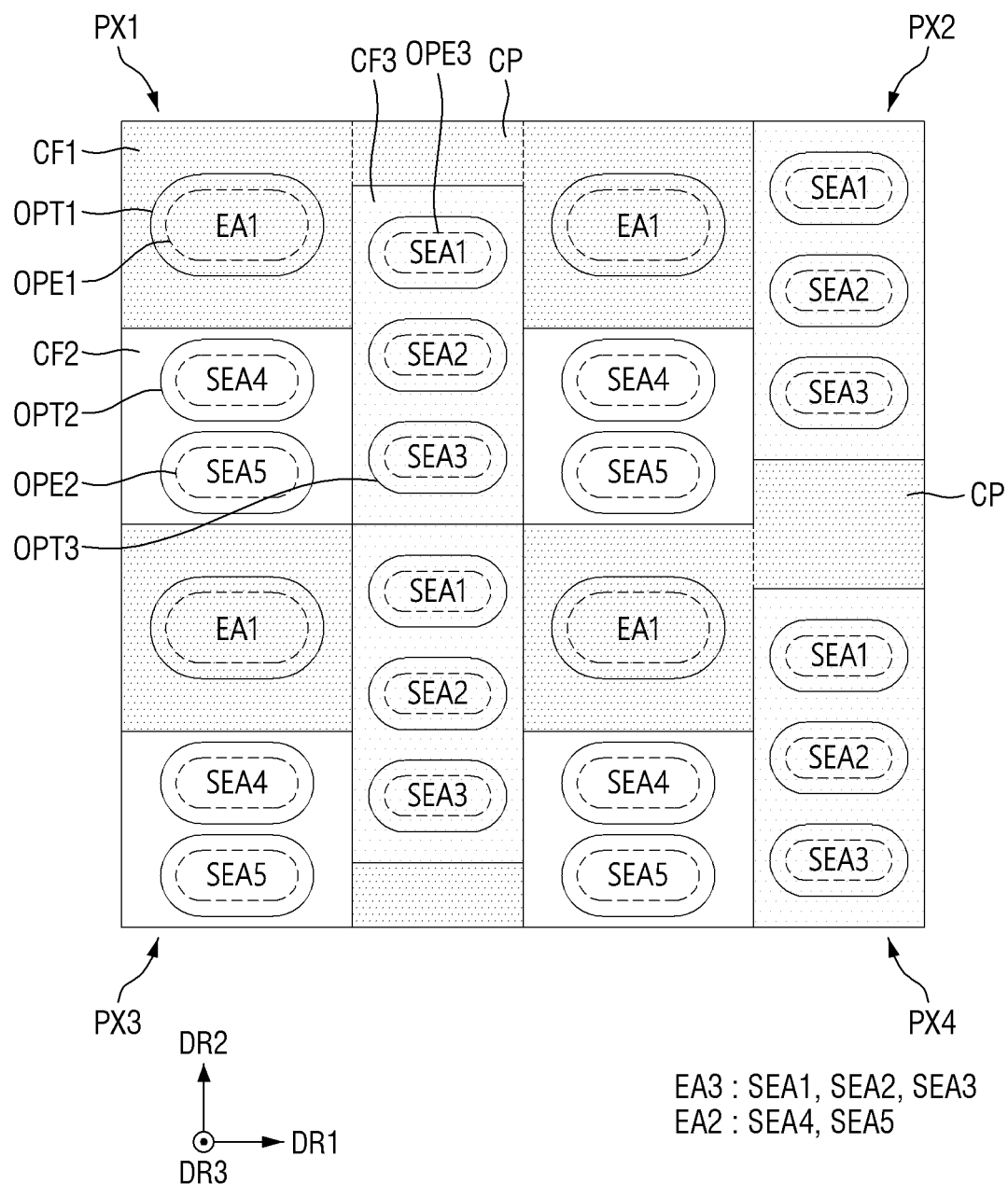
FIG. 15 is a schematic plan view illustrating emission areas disposed in a display area of a display device according to an embodiment.
Figure 16:
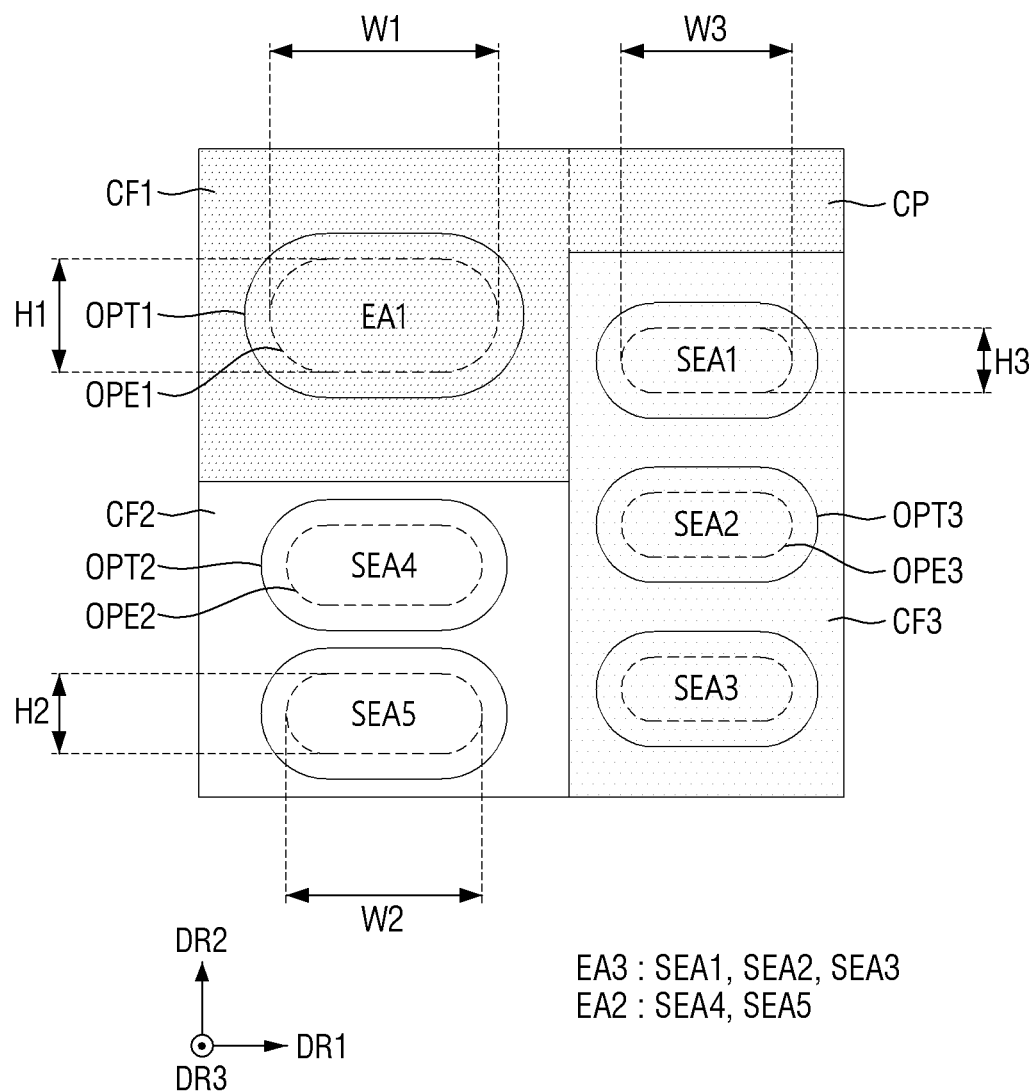
FIG. 16 is a schematic plan view illustrating emission areas disposed in one pixel of FIG. 15.

FIG. 15 is a schematic plan view illustrating emission areas disposed in a display area of a display device according to an embodiment. FIG. 16 is a schematic plan view illustrating emission areas disposed in one pixel of FIG. 15.

Referring to FIGS. 15 and 16, in a display device 10 according to an embodiment, a shape of the respective emission areas EA1, EA2, and EA3 or the openings OPE1, OPE2, and OPE3 of the pixel defining film PDL may be different from those in the above-described embodiments. However, the area ratio between the emission areas EA1, EA2, and EA3 or the ratio between the opening widths W1, W2, and W3 and the opening lengths H1, H2, and H3 of the emission areas EA1, EA2, and EA3 is maintained as it is, and thus, some or a number of emission areas EA1, EA2, and EA3 may include sub-emission areas SEA1, SEA2, SEA3, SEA4, and SEA5.

In plan view, left and right sides of the respective emission areas EA1, EA2, and EA3 in the first direction DR1 and a direction opposite to the first direction DR1 may have a semicircular shape in which they protrude convexly with a curvature, and upper and lower sides of the respective emission areas EA1, EA2, and EA3 in the second direction DR2 and a direction opposite to the second direction DR2 may have a shape in which they extend in the first direction DR1. The emission areas EA1, EA2, and EA3 may have a shape close to an elliptical shape having rounded corners. In the display device 10, the emission areas EA1, EA2, and EA3 have the above-described shape, and thus, a shape of the diffraction pattern due to the reflected light may be changed. Since the diffraction pattern may include patterns formed along linear sides and patterns formed along the rounded corners, a pattern in a specific (or given) direction may not be strong.

The respective emission areas EA1, EA2, and EA3 have a shape other than the circular shape, and thus, the second emission area EA2 and the third emission area EA3 that have relatively small areas may include the sub-emission areas SEA1, SEA2, SEA3, SEA4, and SEA5. For example, the third emission area EA3 may include a first sub-emission area SEA1, a second sub-emission area SEA2, and a third sub-emission area SEA3 spaced apart from each other in the second direction DR2, and the second emission area EA2 may include a fourth sub-emission area SEA4 and a fifth sub-emission area SEA5 spaced apart from each other in the second direction DR2.

In an embodiment, an area of the first emission area EA1 may be greater than an area of each of the fourth sub-emission area SEA4 and the fifth sub-emission area SEA5 of the second emission area EA2 and may be greater than an area of each of the first sub-emission area SEA1, the second sub-emission area SEA2, and the third sub-emission area SEA3 of the third emission area EA3. The area of each of the fourth sub-emission area SEA4 and the fifth sub-emission area SEA5 of the second emission area EA2 may be greater than the area of each of the first sub-emission area SEA1, the second sub-emission area SEA2, and the third sub-emission area SEA3 of the third emission area EA3. An area ratio between the respective emission areas EA1, EA2, and EA3 or sub-emission areas SEA1, SEA2, SEA3, SEA4 and SEA5 is the same as that described above with reference to other embodiments.

In an embodiment, the ratio of the opening lengths H1, H2, and H3 to the opening widths W1, W2, and W3 of the respective emission areas EA1, EA2, and EA3 may not be 1:1. The display device 10 may include the emission areas EA1, EA2, and EA3 of which the opening widths W1, W2, and W3 are greater than the opening lengths H1, H2, and H3. A ratio between the opening widths W1, W2, and W3 or a ratio between the opening lengths H1, H2, and H3 of the different emission areas EA1, EA2, and EA3 may change depending on the wavelength bands of the lights emitted from the respective emission areas EA1, EA2, and EA3.

Figure 17:
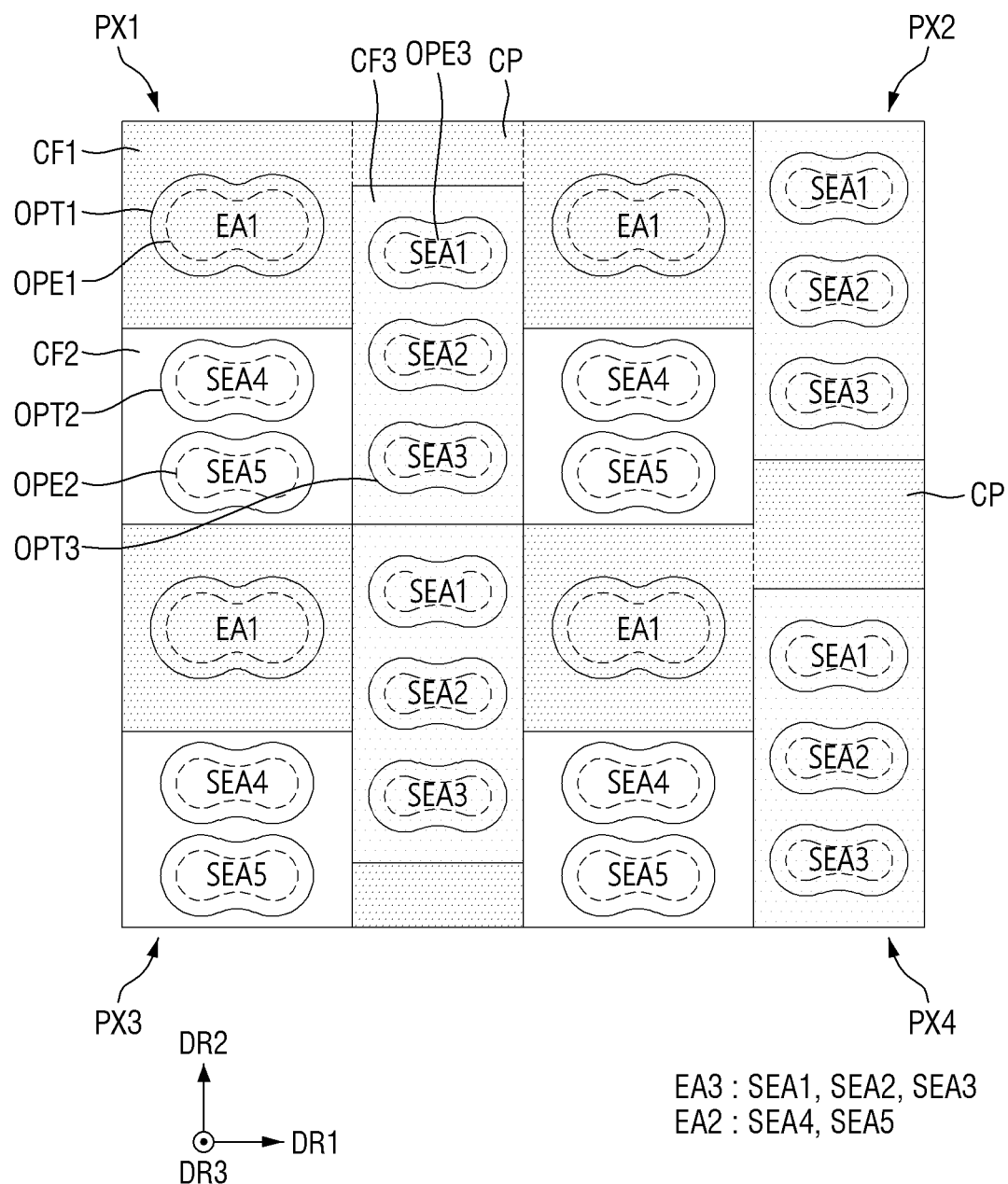
FIG. 17 is a schematic plan view illustrating emission areas disposed in a display area of a display device according to an embodiment.
Figure 18:
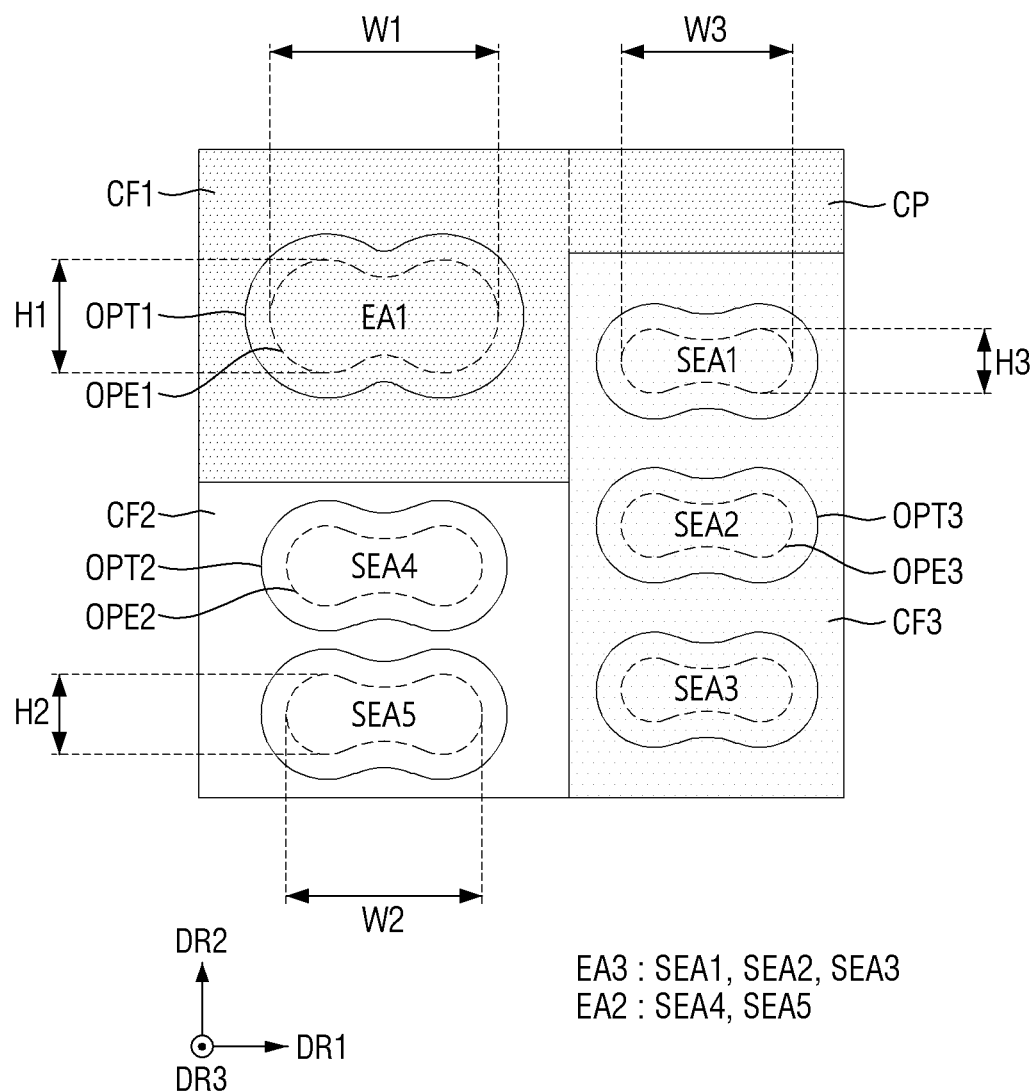
FIG. 18 is a schematic plan view illustrating emission areas disposed in one pixel of FIG. 17.

FIG. 17 is a schematic plan view illustrating emission areas disposed in a display area of a display device according to an embodiment. FIG. 18 is a schematic plan view illustrating emission areas disposed in one pixel of FIG. 17.

Referring to FIGS. 17 and 18, in a display device 10 according to an embodiment, the emission areas EA1, EA2, and EA3 may have a shape close to an elliptical shape having rounded corners, and may have a shape in which upper and lower sides thereof in plan view are concave toward the insides of the emission areas EA1, EA2, and EA3. The embodiment may be different in a partial shape of the emission areas EA1, EA2, and EA3 from an embodiment of FIGS. 15 and 16.

The diffraction pattern of the reflected light may be viewed with relatively strong intensity as sides of the emission areas EA1, EA2, and EA3 are closer to a linear shape. In order to prevent such a problem, in the display device 10, the respective sides of the emission areas EA1, EA2, and EA3 may have a curvature or have a shape close to a rugged pattern. In the display device 10 according to an embodiment, the emission areas EA1, EA2, and EA3 may have a shape in which upper and lower sides of the respective sides of the emission areas EA1, EA2, and EA3 are concave toward the insides of the emission areas EA1, EA2, and EA3, and the diffraction by the reflected light may be dispersed. Accordingly, in the display device 10, the diffraction pattern of the reflected light may be viewed so as not to be strong, and the display device 10 may provide the user with a convenient use feeling.

Figure 19:
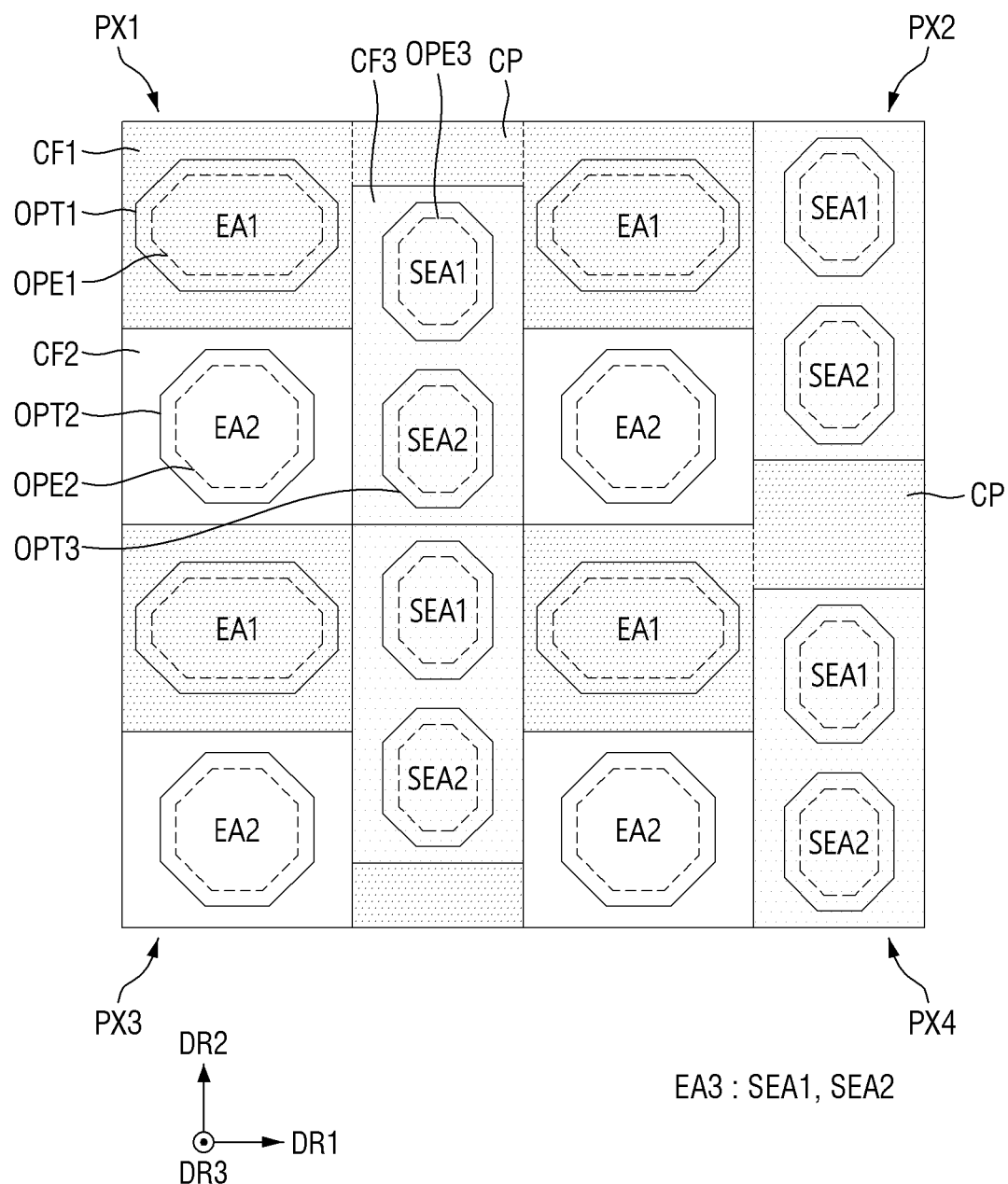
FIG. 19 is a schematic plan view illustrating emission areas disposed in a display area of a display device according to an embodiment.
Figure 20:
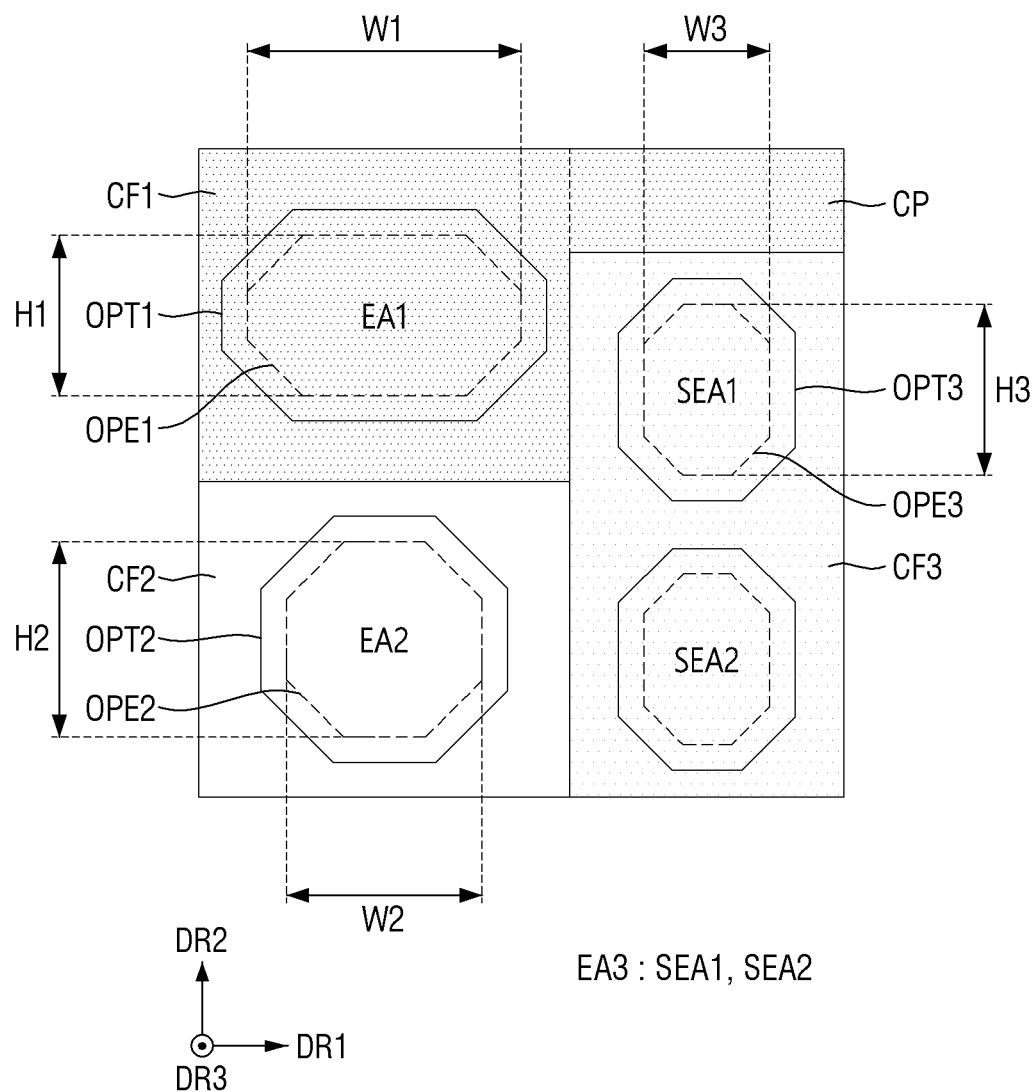
FIG. 20 is a schematic plan view illustrating emission areas disposed in one pixel of FIG. 19.

FIG. 19 is a schematic plan view illustrating emission areas disposed in a display area of a display device according to an embodiment. FIG. 20 is a schematic plan view illustrating emission areas disposed in one pixel of FIG. 19.

Referring to FIGS. 19 and 20, in a display device 10 according to an embodiment, the emission areas EA1, EA2, and EA3 or the openings OPE1, OPE2, and OPE3 of the pixel defining film PDL may have a polygonal shape, and the opening widths W1, W2, and W3 and the opening lengths H1, H1, and H3 of some or a number of emission areas EA1, EA2, and EA3 or openings OPE1, OPE2, and OPE3 of the pixel defining film PDL may not have a ratio of 1:1 therebetween. In an embodiment, the shape of the emission areas EA1, EA2, and EA3 may be a shape obtained by a combination of FIGS. 9 and 15.

For example, the first emission area EA1 may have a shape in which the first opening width W1 is greater than the first opening length H1. The second emission area EA2 may have a shape in which the second opening width W2 and the second opening length H2 have the same ratio of 1:1 therebetween. The third emission area EA3 may have a shape in which the third opening width W3 is smaller than the third opening length H3. The display device 10 may disperse the diffraction by reflected light by adjusting the shape of the respective emission areas EA1, EA2, and EA, and the ratios of the opening lengths H1, H2, and H3 to the opening widths W1, W2, and W3.

Also in a case of an embodiment, the area ratio between the different emission areas EA1, EA2, and EA3 may be the same as that of in the above-described embodiment. However, the ratios of the opening lengths H1, H2, and H3 to the opening widths W1, W2, and W3 of the respective emission areas EA1, EA2, and EA3 are different from each other, and thus, a ratio between the opening widths W1, W2, and W3 or a ratio between the opening lengths H1, H2, and H3 of the different emission areas EA1, EA2, and EA3 may be different from the area ratio. For example, the first emission area EA1 may have a greater area than the second emission area EA2 and the third emission area EA3, but the first opening width W1 of the first emission area EA1 may be greater than or equal to the second opening width W2 of the second emission area EA2 and be greater than the third opening width W3 of the third emission area EA3. On the other hand, the first opening length H1 of the first emission area EA1 may be smaller than the opening lengths H2 and H3 of the second emission area EA2 and the third emission area EA3.

Figure 21:
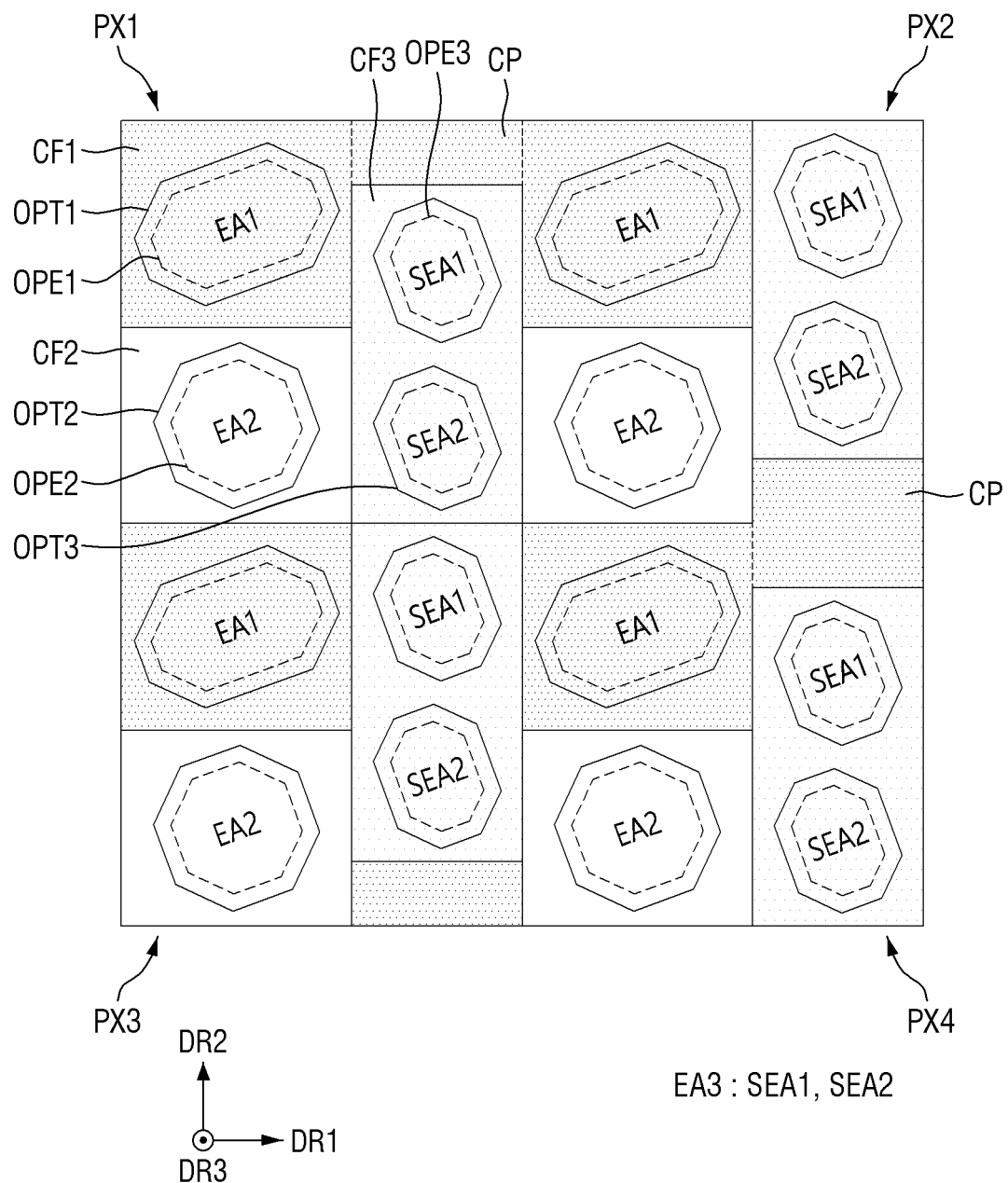
FIG. 21 is a schematic plan view illustrating emission areas disposed in a display area of a display device according to an embodiment.
Figure 22:
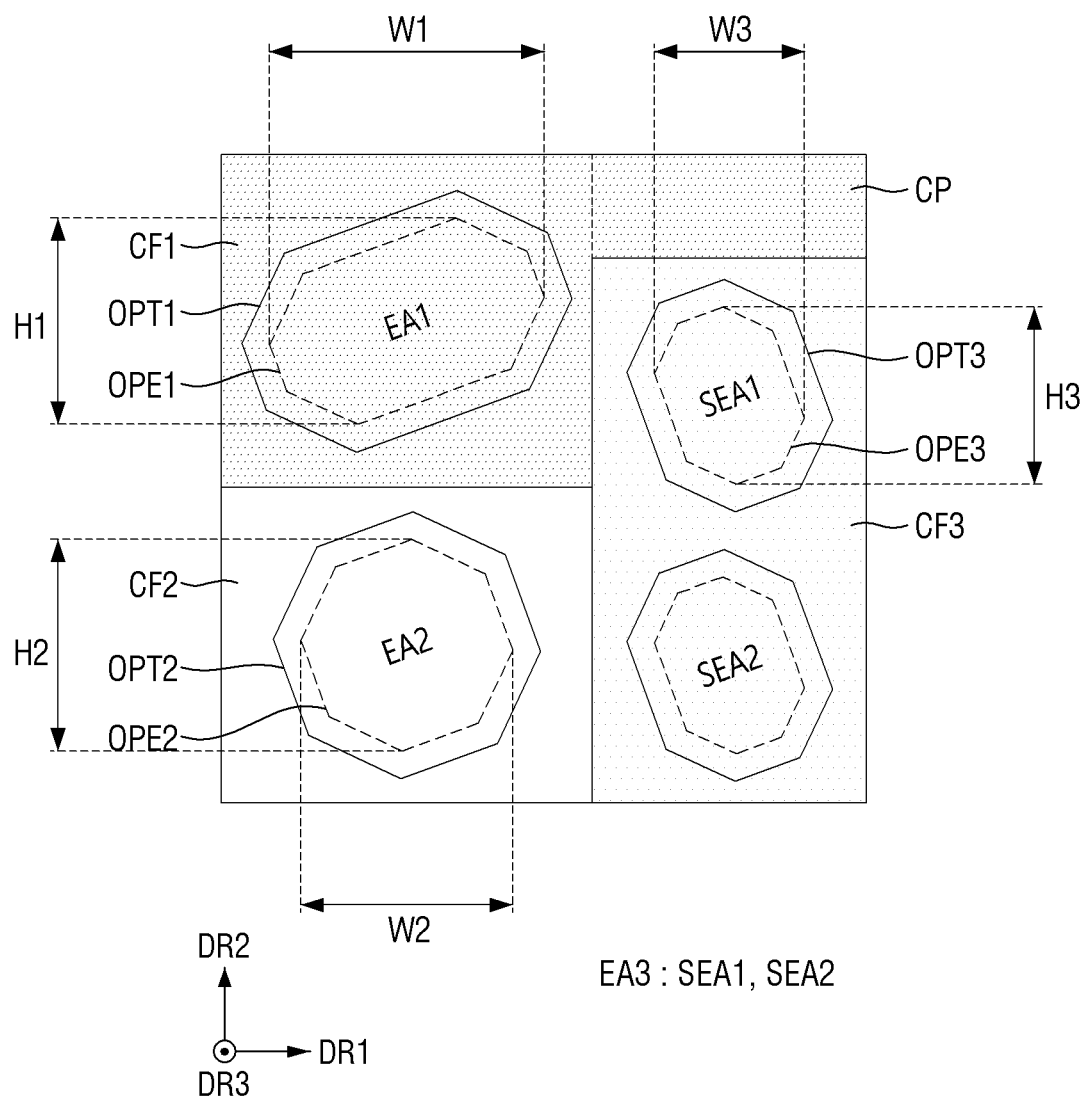
FIG. 22 is a schematic plan view illustrating emission areas disposed in one pixel of FIG. 21.

FIG. 21 is a schematic plan view illustrating emission areas disposed in a display area of a display device according to an embodiment. FIG. 22 is a schematic plan view illustrating emission areas disposed in one pixel of FIG. 21.

Referring to FIGS. 21 and 22, in a display device 10 according to an embodiment, the respective emission areas EA1, EA2, and EA3 may have a polygonal shape, and respective sides of the emission areas EA1, EA2, and EA3 may be disposed so as not to be parallel to the first direction DR1 or the second direction DR2 in which the pixels PX1, PX2, PX3, and PX4 are arranged. The display device 10 according to an embodiment is different from the display device 10 according to an embodiment of FIGS. 19 and 20 in that the emission areas EA1, EA2, and EA3 have the polygonal shape and are inclined in a specific (or given) direction.

Light reflected and diffracted from specific (or given) emission areas EA1, EA2, and EA3 of any one of the pixel PX1, PX2, PX3, and PX4 may interfere with lights reflected and diffracted light from the same emission area EA1, EA2, and EA3 of the other pixels PX1, PX2, PX3, and PX4. Lights diffracted from linear sides of the respective sides of the emission areas EA1, EA2, and EA3 may readily interfere with lights diffracted from the same linear sides in the other emission areas EA1, EA2, and EA3. In case that an extension direction of the sides of the emission areas EA1, EA2, and EA3 and an arrangement direction of the pixels PX1, PX2, PX3, and PX4 are the same as each other, the diffraction pattern of the reflected lights may be strongly viewed. However, in the display device 10, the pixels PX1, PX2, PX3, and PX4 are arranged in the first direction DR1 or the second direction DR2, whereas the respective emission areas EA1, EA2, and EA3 may have the polygonal shape and the respective sides of the emission areas EA1, EA2, and EA3 may extend in a direction not parallel to the first direction DR1 and the second direction DR2 to disperse the diffraction of the reflected light.

For example, the first emission area EA1 may have a regular octagonal shape, and respective sides of the first emission area EA1 may extend in a diagonal direction (or a third direction) that is not parallel to the first direction DR1 and the second direction DR2. Light reflected and diffracted from the first emission area EA1 disposed in the first pixel PX1 may not interfere with light reflected and diffracted from the first emission area EA1 of the second pixel PX2 adjacent to the first pixel PX1 in the first direction DR1 or the third pixel PX3 adjacent to the first pixel PX1 in the second direction DR2. In the display device 10, the emission areas EA1, EA2, and EA3 may have the polygonal shape, the extension direction of the respective sides of the emission areas EA1, EA2, and EA3 may not be parallel to the arrangement direction of the pixels PX1, PX2, PX3, and PX4, and the diffraction of the reflected light may be dispersed.

The first emission area EA1 may have a shape in which the first opening width W1 is greater than the first opening length H1, and a width direction of the first emission area EA1 may not be parallel to the first direction DR1 and the second direction DR2. The third emission area EA3 may have a shape in which the third opening length H3 is greater than the third opening width W3, and a length direction of the third emission area EA3 may not be parallel to the first direction DR1 and the second direction DR2. On the other hand, since a ratio of the second opening length H2 to the second opening width W2 of the second emission area EA2 is 1:1, the respective sides of the second emission area EA2 may not be parallel to the first direction DR1 and the second direction DR2, but a width direction and a length direction of the second emission area EA2 may be parallel to the first direction DR1 and the second direction DR2.

In an embodiment, a case where different emission areas EA1, EA2, and EA3 in one pixel PX1, PX2, PX3, or PX4 or in the pixels PX1, PX2, PX3, and PX4 are inclined in the same direction has been illustrated. However, the disclosure is not limited thereto, and in the display device 10, inclination directions of the emission areas EA1, EA2, and EA3 having the polygonal shape may be different from each other.

Figure 23:
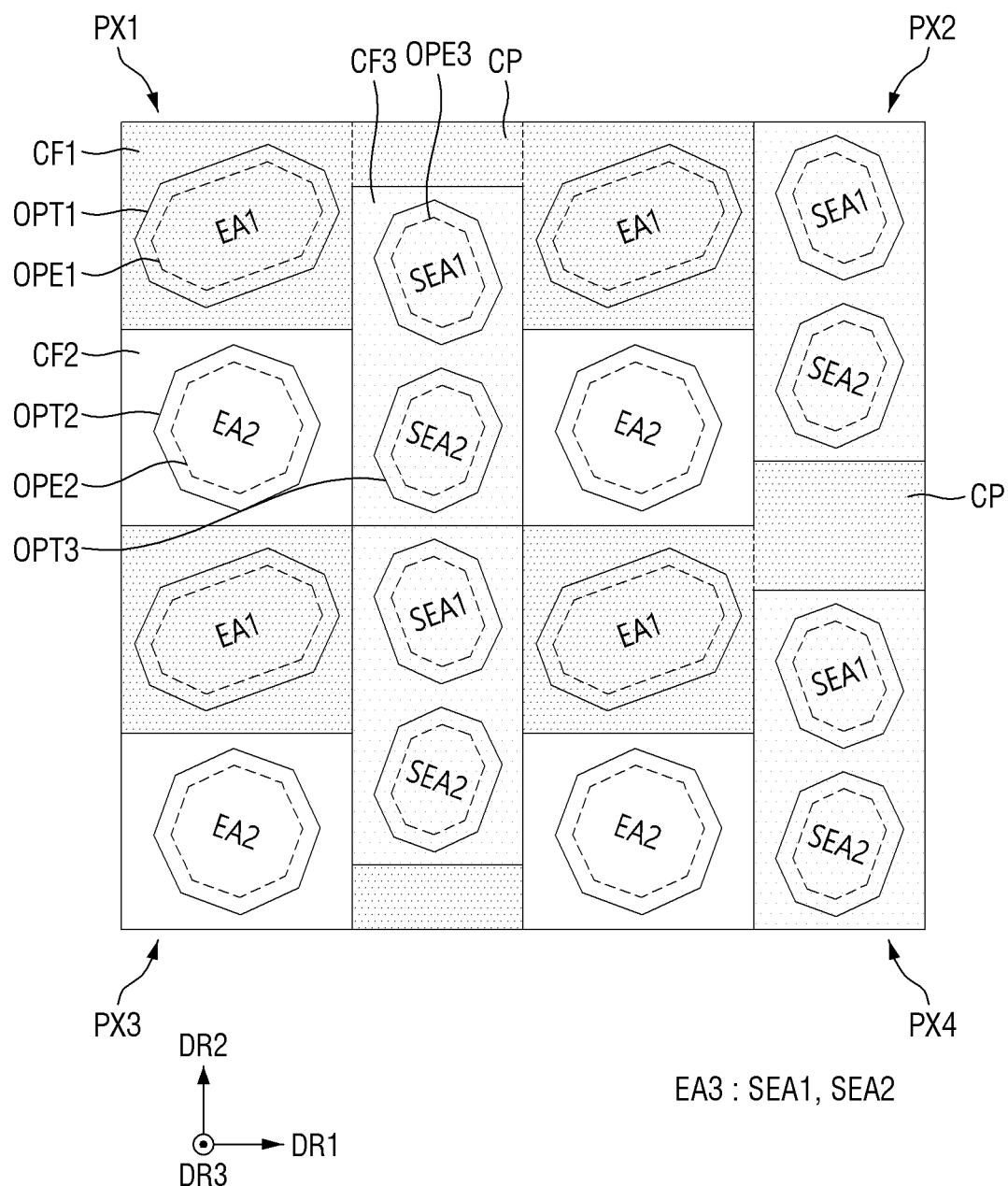
FIGS. 23 and 24 are schematic plan views illustrating emission areas disposed in a display area of a display device according to an embodiment.
Figure 24:
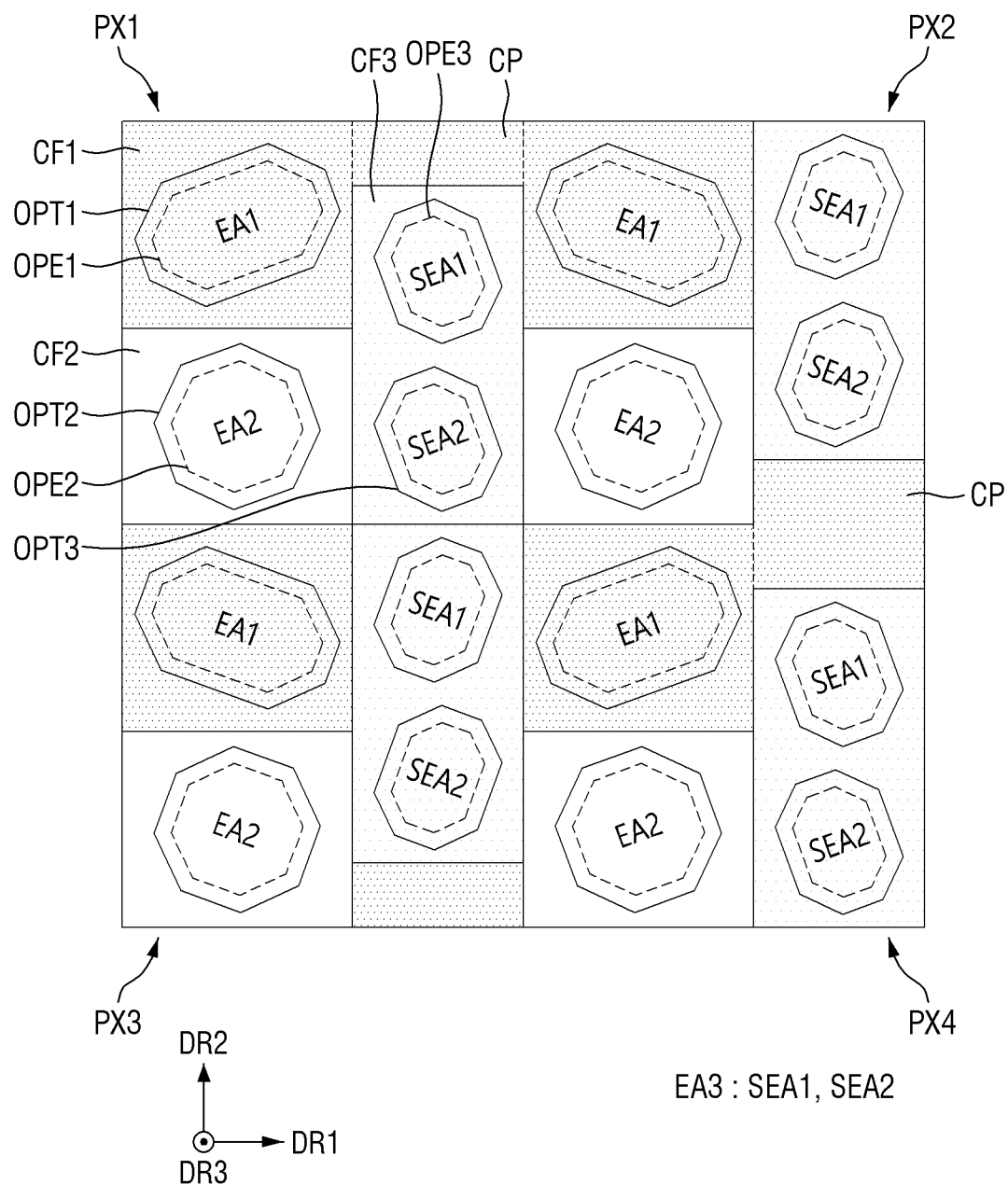

FIGS. 23 and 24 are schematic plan views illustrating emission areas disposed in a display area of a display device according to an embodiment.

Referring to FIG. 23, in a display device 10 according to an embodiment, different emission areas EA1, EA2, and EA3 within one pixel PX1, PX2, PX3, or PX4 may be inclined in different directions. For example, in the respective pixels PX1, PX2, PX3, and PX4, length directions of the first emission area EA1 and the first sub-emission area SEAL of the third emission area EA3 (directions of the first opening length H1 and the third opening length H3) may be partially inclined leftward from the second direction DR2. On the other hand, a length direction of the second sub-emission area SEA2 of the third emission area EA3 (a direction of the third opening length H3) may be partially inclined rightward from the second direction DR2. Since the second opening width W2 and the second opening length H2 of the second emission area EA2 have the same ratio therebetween, extension directions of the respective sides of the second emission area EA2 may not be parallel to the first direction DR1 and the second direction DR2, but directions of the second opening width W2 and the second opening length H2 may be parallel to the first direction DR1 and the second direction DR2.

In the display device 10, the inclination directions of different emission areas EA1, EA2, and EA3 within one pixel PX1, PX2, PX3, or PX4 and the extension directions of the respective sides of the emission areas EA1, EA2, and EA3 may be partially different from each other. On the other hand, in the display device 10, inclination directions of the same emission areas EA1, EA2, and EA3 in different pixels PX1, PX2, PX3, and PX4 may be the same as each other. For example, a length direction of the first emission area EA1 of the first pixel PX1 may be parallel to a length direction of the first emission area EA1 of the second pixel PX2. In the display device 10, the inclination directions of the emission areas EA1, EA2, and EA3 disposed over the entire display area DA are designed to be different from each other, such that diffraction between specific (or given) emission areas EA1, EA2, and EA3 may be dispersed.

Referring to FIG. 24, in a display device 10 according to an embodiment, the same emission areas EA1, EA2, and EA3 within different pixels PX1, PX2, PX3, and PX4 may be inclined in different directions. For example, in the first pixel PX1 and the fourth pixel PX4, length directions of the first emission area EA1 and the sub-emission areas SEAL and SEA2 of the third emission area EA3 (directions of the first opening length H1 and the third opening length H3) may be partially inclined leftward from the second direction DR2. On the other hand, in the second pixel PX2 and the third pixel PX3, length directions of the first emission area EA1 and the sub-emission areas SEA1 and SEA2 of the third emission area EA3 (directions of the first opening length H1 and the third opening length H3) may be partially inclined rightward from the second direction DR2. Since the second opening width W2 and the second opening length H2 of the second emission area EA2 in each of the pixels PX1, PX2, PX3, and PX4 have the same ratio therebetween, extension directions of the respective sides of the second emission area EA2 may not be parallel to the first direction DR1 and the second direction DR2, but directions of the second opening width W2 and the second opening length H2 may be parallel to the first direction DR1 and the second direction DR2.

In the display device 10, the inclination directions of the same emission areas EA1, EA2, and EA3 in the different pixels PX1, PX2, PX3, and PX4 and the extension directions of the respective sides of the emission areas EA1, EA2, and EA3 may be partially different from each other. In the display device 10, the inclination directions of the same emission areas EA1, EA2, and EA3 in the different pixels PX1, PX2, PX3, and PX4 may be different from each other. For example, a length direction of the first emission area EA1 of the first pixel PX1 may not be parallel to a length direction of the first emission area EA1 of the second pixel PX2. In the display device 10, the inclination directions of the emission areas EA1, EA2, and EA3 disposed over the entire display area DA are designed to be different from each other, such that diffraction between specific (or given) emission areas EA1, EA2, and EA3 may be dispersed.

Figure 25:
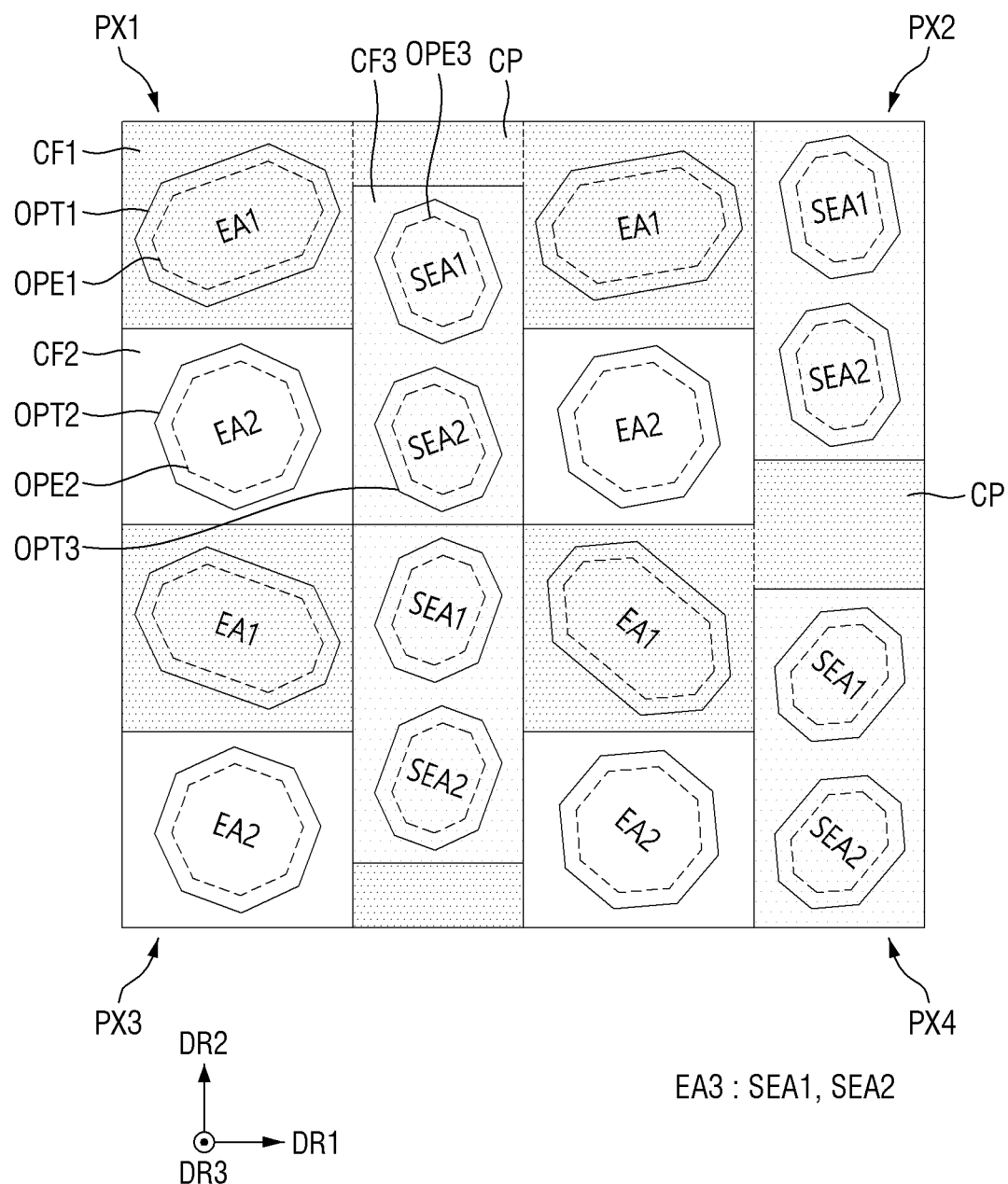
FIG. 25 is a schematic plan view illustrating emission areas disposed in a display area of a display device according to an embodiment.

FIG. 25 is a schematic plan view illustrating emission areas disposed in a display area of a display device according to an embodiment.

Referring to FIG. 25, in a display device 10 according to an embodiment, inclination directions and inclination degrees of the same emission areas EA1, EA2, and EA3 within different pixels PX1, PX2, PX3, and PX4 may be different from each other. For example, in the first pixel PX1 and the second pixel PX2, length directions of the first emission area EA1 and the sub-emission areas SEAL and SEA2 of the third emission area EA3 (directions of the first opening length H1 and the third opening length H3) may be partially inclined leftward from the second direction DR2. On the other hand, in the third pixel PX3 and the fourth pixel PX4, length directions of the first emission area EA1 and the sub-emission areas SEAL and SEA2 of the third emission area EA3 (directions of the first opening length H1 and the third opening length H3) may be partially inclined rightward from the second direction DR2. Since the second opening width W2 and the second opening length H2 of the second emission area EA2 in each of the pixels PX1, PX2, PX3, and PX4 have the same ratio therebetween, extension directions of the respective sides of the second emission area EA2 may not be parallel to the first direction DR1 and the second direction DR2, but directions of the second opening width W2 and the second opening length H2 may be parallel to the first direction DR1 and the second direction DR2.

In the first pixel PX1 and the second pixel PX2, inclination degrees and angles of the length directions of the first emission area EA1 and the sub-emission areas SEAL and SEA2 of the third emission area EA3 (directions of the first opening length H1 and the third opening length H3) may be different from each other. The first emission area EA1 and the sub-emission areas SEA1 and SEA2 of the third emission area EA3 of the first pixel PX1 may be inclined at a greater angle than the first emission area EA1 and the sub-emission areas SEA1 and SEA2 of the third emission area EA3 of the second pixel PX2.

Similarly, in the third pixel PX3 and the fourth pixel PX4, inclination degrees and angles of the length directions of the first emission area EA1 and the sub-emission areas SEA1 and SEA2 of the third emission area EA3 (directions of the first opening length H1 and the third opening length H3) may be different from each other. The first emission area EA1 and the sub-emission areas SEAL and SEA2 of the third emission area EA3 of the fourth pixel PX4 may be inclined at a greater angle than the first emission area EA1 and the sub-emission areas SEAL and SEA2 of the third emission area EA3 of the third pixel PX3.

Angles at which the first emission areas EA1 and the sub-emission areas SEA1 and SEA2 of the third emission areas EA3 of the first pixel PX1 and the third pixel PX3 are inclined in specific (or given) directions may be the same as each other. On the other hand, angles at which the first emission areas EA1 and the sub-emission areas SEA1 and SEA2 of the third emission areas EA3 of the second pixel PX2 and the fourth pixel PX4 are inclined may be different from those of the other pixels PX1 and PX3. The first emission area EA1 and the sub-emission areas SEA1 and SEA2 of the third emission area EA3 of the second pixel PX2 may be inclined at a relatively small angle, and the first emission area EA1 and the sub-emission areas SEA1 and SEA2 of the third emission area EA3 of the fourth pixel PX4 may be inclined at a relatively great angle.

In the display device 10, the inclination directions and the inclination angles of the same emission areas EA1, EA2, and EA3 in the different pixels PX1, PX2, PX3, and PX4 and the extension directions of the respective sides of the emission areas EA1, EA2, and EA3 may be partially different from each other. In the display device 10, the inclination directions of the same emission areas EA1, EA2, and EA3 in the different pixels PX1, PX2, PX3, and PX4 may be different from each other. For example, a length direction of the first emission area EA1 of the first pixel PX1 may not be parallel to a length direction of the first emission area EA1 of the second pixel PX2. In the display device 10, the inclination directions of the emission areas EA1, EA2, and EA3 disposed over the entire display area DA are designed to be different from each other, such that diffraction between specific (or given) emission areas EA1, EA2, and EA3 may be dispersed.

In concluding the detailed description, those skilled in the art will appreciate that many variations and modifications can be made to the disclosed embodiments without substantially departing from the principles of the disclosure. Therefore, the disclosed embodiments are used in a generic and descriptive sense only and not for purposes of limitation.

What is claimed is:

1. A display device comprising:
   pixels disposed in a first direction and a second direction intersecting the first direction, the pixels including emission areas including light emitting elements;
   a light blocking layer including holes overlapping the emission areas in plan view and disposed between adjacent ones of the emission areas; and
   color filters disposed in the holes of the light blocking layer and overlapping the emission areas in plan view, wherein
   the emission areas include:
      a first emission area emitting light of a first color;
      a second emission area emitting light of a second color of a shorter wavelength band than the light of the first color; and
      a third emission area emitting light of a third color of a shorter wavelength band than the light of the second color,
   the color filters are disposed on the light blocking layer such that adjacent ones of the color filters at least partially overlap each other in plan view,
   the color filters include:
      a first color filter overlapping the first emission area in plan view and selectively transmitting the light of the first color;
      a second color filter overlapping the second emission area in plan view and selectively transmitting the light of the second color; and
      a third color filter overlapping the third emission area in plan view and selectively transmitting the light of the third color,
   an area of the first emission area is greater than an area of each of the second emission area and an area of the third emission area,
   the area of the second emission area is greater than the area of the third emission area, and
   a ratio between opening widths of the first emission area, the second emission area, and the third emission area is in a range of about 1.33:1.15:1 to about 1.43:1.25:1.

2. The display device of claim 1, wherein a ratio between areas of the first color filter, the second color filter, and the third color filter is different from a ratio between the areas of the first emission area, the second emission area, and the third emission area.

3. The display device of claim 1, wherein
   the third emission area includes a first sub-emission area and a second sub-emission area spaced apart from each other in the second direction, and
   each of the first emission area and the second emission area has a greater area than an area of each of the first sub-emission area and the second sub-emission area.

4. The display device of claim 3, wherein
   the third emission area further includes a third sub-emission area spaced apart from the second sub-emission area in the second direction, and
   the second emission area includes a fourth sub-emission area and a fifth sub-emission area spaced apart from each other in the second direction.

5. The display device of claim 4, wherein
   each of the fourth sub-emission area and the fifth sub-emission area has a smaller area than an area of the first emission area, and
   each of the fourth sub-emission area and the fifth sub-emission area has a greater area than each of the first sub-emission area, the second sub-emission area, and the third sub-emission area.

6. The display device of claim 1, wherein
each of the first emission area, the second emission area, and the third emission area has a substantially polygonal shape, and
sides of each of the first emission area, the second emission area, and the third emission area are not parallel to the first direction and the second direction.

7. The display device of claim 6, wherein a direction of an opening length of the first emission area and a direction of an opening length of the third emission area are inclined from the second direction.

8. The display device of claim 7, wherein
the pixels include:
a first pixel;
a second pixel adjacent to the first pixel in the first direction; and
a third pixel adjacent to the first pixel in the second direction, and
the direction of the opening length of the first emission area disposed in the first pixel is parallel to the direction of the opening length of the first emission area disposed in the second pixel.

9. The display device of claim 1, wherein each of the first emission area, the second emission area, and the third emission area has a substantially circular shape.

10. The display device of claim 1, wherein a center of at least one of the first emission area, the second emission area, and the third emission area is offset from a center of a corresponding one of the color filters in plan view.

11. A display device comprising:
a display layer including a pixel defining film including openings forming emission areas emitting light of different colors and including light emitting elements;
a light blocking layer disposed on the display layer and including holes overlapping the emission areas in plan view; and
color filters disposed in the holes of the light blocking layer and overlapping the emission areas in plan view, wherein
the openings of the pixel defining film include:
a first opening forming a first emission area emitting light of a first color;
a second opening forming a second emission area emitting light of a second color of a shorter wavelength band than the light of the first color; and
a third opening forming a third emission area emitting light of a third color of a shorter wavelength band than the light of the first color and the light of the second color, the color filters include:
a first color filter of the first color overlapping the first emission area in plan view;
a second color filter of the second color overlapping the second emission area in plan view; and
a third color filter of the third color overlapping the third emission area in plan view,
the second color filter overlaps portions of each of the first color filter and the third color filter that are both adjacent to the second color filter and that overlap the light blocking layer in plan view,
an area of the first opening is greater than each of an area of the second opening and an area of the third opening,
the area of the second opening is greater than the area of the third opening, and
opening widths of the first opening, the second opening, and the third opening in a first direction and opening lengths of the first opening, the second opening, and the third opening in a second direction intersecting the first direction are different from each other, respectively.

12. The display device of claim 11, wherein a ratio between the opening widths of the first opening, the second opening, and the third opening is in a range of about 1.33:1.15:1 to about 1.43:1.25:1.

13. The display device of claim 11, wherein sides of each of the first opening, the second opening, and the third opening in the first direction have a curvature, and sides of each of the first opening, the second opening, and the third opening in the second direction have a substantially linear shape.

14. The display device of claim 11, wherein
sides of each of the first opening, the second opening, and the third opening in the first direction have a substantially convex shape, and
sides of each of the first opening, the second opening, and the third opening in the second direction have a substantially inwardly concave shape.

15. The display device of claim 11, wherein each of the first opening, the second opening, and the third opening has a substantially polygonal shape.

16. The display device of claim 15, wherein respective sides of each of the first opening, the second opening, and the third opening are not parallel to the first direction and the second direction intersecting the first direction.

17. The display device of claim 11, wherein a center of the first opening is offset from a center of the first color filter in plan view.

18. The display device of claim 11, wherein a ratio between areas of the first color filter, the second color filter, and the third color filter is different from a ratio between the areas of the first opening, the second opening, and the third opening.

19. The display device of claim 18, further comprising:
a color pattern disposed on the light blocking layer, wherein
the color pattern and the first color filter have a same color, and
the color pattern-contacts the third color filter.

20. An electronic device comprising:
pixels disposed in a first direction and a second direction intersecting the first direction, the pixels including emission areas including light emitting elements;
a light blocking layer including holes overlapping the emission areas in plan view and disposed between adjacent ones of the emission areas; and
color filters disposed in the holes of the light blocking layer and overlapping the emission areas in plan view, wherein
the emission areas include:
a first emission area emitting light of a first color;
a second emission area emitting light of a second color of a shorter wavelength band than the light of the first color; and
a third emission area emitting light of a third color of a shorter wavelength band than the light of the second color,
the color filters are disposed on the light blocking layer such that adjacent ones of the color filters at least partially overlap each other in plan view,
the color filters include:
a first color filter overlapping the first emission area in plan view and selectively transmitting the light of the first color;

a second color filter overlapping the second emission area in plan view and selectively transmitting the light of the second color; and
   a third color filter overlapping the third emission area in plan view and selectively transmitting the light of the third color,
an area of the first emission area is greater than an area of each of the second emission area; and an area of the third emission area,
the area of the second emission area is greater than the area of the third emission area, and
a ratio between opening widths of the first emission area, the second emission area, and the third emission area is in a range of about 1.33:1.15:1 to about 1.43:1.25:1.

* * * * *